(12) United States Patent
Yu et al.

(10) Patent No.: US 10,157,882 B2
(45) Date of Patent: *Dec. 18, 2018

(54) 3D CHIP-ON-WAFER-ON-SUBSTRATE STRUCTURE WITH VIA LAST PROCESS

(71) Applicant: Taiwan Semiconductor Manufacturing Company, Ltd., Hsinchu (TW)

(72) Inventors: Chen-Hua Yu, Hsinchu (TW); Ming-Fa Chen, Taichung (TW); Wen-Ching Tsai, Hsinchu (TW); Sung-Feng Yeh, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/695,553

(22) Filed: Sep. 5, 2017

(65) Prior Publication Data

US 2017/0365579 A1    Dec. 21, 2017

Related U.S. Application Data

(62) Division of application No. 14/444,681, filed on Jul. 28, 2014, now Pat. No. 9,754,918.

(Continued)

(51) Int. Cl.
*H01L 25/065* (2006.01)
*H01L 23/00* (2006.01)
(Continued)

(52) U.S. Cl.
CPC ...... *H01L 25/065* (2013.01); *H01L 21/76898* (2013.01); *H01L 23/48* (2013.01);
(Continued)

(58) Field of Classification Search
None
See application file for complete search history.

(56) References Cited

U.S. PATENT DOCUMENTS 6,607,938 B2   8/2003   Kwon et al.
6,867,073 B1   3/2005   Enquist
(Continued)

FOREIGN PATENT DOCUMENTS

CN   101091243 A   12/2007
CN   102931102 A   2/2013
(Continued)

*Primary Examiner* — Telly Green
(74) *Attorney, Agent, or Firm* — Slater Matsil, LLP

(57) ABSTRACT

Disclosed herein is a package comprising a first redistribution layer (RDL) disposed on a first side of a first semiconductor substrate and a second RDL disposed on a second semiconductor substrate, wherein the first RDL is bonded to the second RDL. First conductive elements are disposed in the first RDL and the second RDL. First vias extend from one or more of the first conductive elements through the first semiconductor substrate to a second side of the first semiconductor substrate opposite the first side. First spacers are interposed between the first semiconductor substrate and the first vias and each extend from a respective one of the first conductive elements through the first semiconductor substrate.

20 Claims, 19 Drawing Sheets

Related U.S. Application Data

(60) Provisional application No. 61/991,287, filed on May 9, 2014.

(51) Int. Cl.
*H01L 21/768* (2006.01)
*H01L 23/48* (2006.01)
*H01L 23/538* (2006.01)
*H01L 21/311* (2006.01)

(52) U.S. Cl.
CPC ........ *H01L 23/481* (2013.01); *H01L 23/5384* (2013.01); *H01L 24/03* (2013.01); *H01L 24/06* (2013.01); *H01L 24/08* (2013.01); *H01L 24/19* (2013.01); *H01L 24/24* (2013.01); *H01L 24/92* (2013.01); *H01L 21/31111* (2013.01); *H01L 21/31116* (2013.01); *H01L 21/76805* (2013.01); *H01L 24/80* (2013.01); *H01L 24/82* (2013.01); *H01L 2224/0212* (2013.01); *H01L 2224/0231* (2013.01); *H01L 2224/0237* (2013.01); *H01L 2224/0401* (2013.01); *H01L 2224/04105* (2013.01); *H01L 2224/05567* (2013.01); *H01L 2224/05647* (2013.01); *H01L 2224/08145* (2013.01); *H01L 2224/09181* (2013.01); *H01L 2224/11* (2013.01); *H01L 2224/12105* (2013.01); *H01L 2224/131* (2013.01); *H01L 2224/13022* (2013.01); *H01L 2224/18* (2013.01); *H01L 2224/24146* (2013.01); *H01L 2224/73267* (2013.01); *H01L 2224/80896* (2013.01); *H01L 2224/821* (2013.01); *H01L 2224/82031* (2013.01); *H01L 2224/9202* (2013.01); *H01L 2224/9212* (2013.01); *H01L 2224/92244* (2013.01); *H01L 2224/94* (2013.01); *H01L 2924/18162* (2013.01)

(56) References Cited

U.S. PATENT DOCUMENTS

| | | | |
|---|---|---|---|
| 7,795,139 | B2 | 9/2010 | Han et al. |
| 8,350,377 | B2 | 1/2013 | Yang |
| 8,975,726 | B2 | 3/2015 | Chen et al. |
| 9,059,109 | B2 | 6/2015 | Lin et al. |
| 9,449,837 | B2* | 9/2016 | Yu .................... H01L 21/31116 |
| 9,698,081 | B2 | 7/2017 | Yu et al. |
| 9,806,055 | B2* | 10/2017 | Yu .......................... H01L 21/563 |
| 2003/0017647 | A1 | 1/2003 | Kwon et al. |
| 2004/0021139 | A1 | 2/2004 | Jackson et al. |
| 2005/0104219 | A1 | 5/2005 | Matsui |
| 2008/0116584 | A1 | 5/2008 | Sitaram |
| 2008/0318361 | A1 | 12/2008 | Han et al. |
| 2011/0133339 | A1 | 6/2011 | Wang |
| 2011/0204505 | A1 | 8/2011 | Pagaila et al. |
| 2013/0040423 | A1 | 2/2013 | Tung et al. |
| 2013/0285257 | A1 | 10/2013 | Lee et al. |
| 2014/0264933 | A1 | 9/2014 | Yu et al. |
| 2015/0145593 | A1 | 5/2015 | Johnson |
| 2015/0318263 | A1 | 11/2015 | Yu et al. |
| 2015/0318267 | A1 | 11/2015 | Yu |
| 2015/0325497 | A1 | 11/2015 | Yu et al. |
| 2018/0122862 | A1* | 5/2018 | Choi .................... H01L 27/322 |

FOREIGN PATENT DOCUMENTS

| | | |
|---|---|---|
| CN | 103730434 A | 4/2014 |
| KR | 20030008615 A | 1/2003 |
| TW | 201208004 A | 2/2012 |

* cited by examiner

3D CHIP-ON-WAFER-ON-SUBSTRATE STRUCTURE WITH VIA LAST PROCESS

PRIORITY CLAIM AND CROSS-REFERENCE

This application is a divisional of U.S. patent application Ser. No. 14/444,681, filed on Jul. 28, 2014, entitled "3D Chip-on-Wafer-on-Substrate Structure with Via Last Process," which claims the benefit of U.S. Provisional Application No. 61/991,287, filed on May 9, 2014, entitled "3D Chip-on-Wafer-on-Substrate Structure with Via Last Process," which applications are hereby incorporated by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked semiconductor devices, e.g., 3D integrated circuits (3DIC), have emerged as an effective alternative to further reduce the physical size of a semiconductor device. In a stacked semiconductor device, active circuits such as logic, memory, processor circuits and the like are fabricated on different semiconductor wafers. Two or more semiconductor wafers may be installed on top of one another to further reduce the form factor of the semiconductor device.

Two semiconductor wafers or dies may be bonded together through suitable bonding techniques. The commonly used bonding techniques include direct bonding, chemically activated bonding, plasma activated bonding, anodic bonding, eutectic bonding, glass frit bonding, adhesive bonding, thermo-compressive bonding, reactive bonding and/or the like. An electrical connection may be provided between the stacked semiconductor wafers. The stacked semiconductor devices may provide a higher density with smaller form factors and allow for increased performance and lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
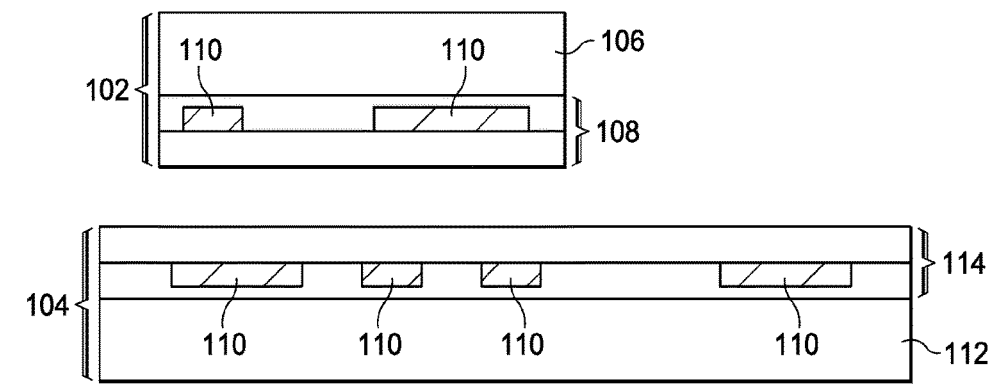
FIGS. 1-15 illustrate cross-sectional views of intermediate processing steps in forming a chip-on-wafer structure using a via last process according to an embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor devices are bonded together to form packages with various capabilities. In some processes, dies, wafers or a combination of dies and wafers, are bonded together using direct surface bonding such as oxide-to-oxide bonding, through hybrid bonding, or the like. It has been discovered that interconnections between bonded wafers can be provided using a via last process. In the via last process, the vias are formed through one of the dies after the dies have been bonded to provide electrical connection between the dies, and to provide power and data connections between the dies and external connectors. It has been further discovered that conductive vias formed through the substrate of one or more dies can be insulated from the substrate by using a self-aligning insulating spacer on the sidewalls of the via openings. The self-aligning spacer on the sidewalls permits narrower, taller vias, and improves the aspect ratio of the vias to between about 3 and about 10. The improved aspect ratio results in more compactly arranged via arrays.

FIG. 1 illustrates a cross-sectional view of a wafer 104 and die 102 prior to bonding according to an embodiment. A die 102 comprises a die substrate 106 such as a semiconductor having one or more active devices formed therein. A die redistribution layer (RDL) 108 is disposed on the die substrate 106. The die RDL 108 comprises one or more dielectric layers with conductive elements 110 disposed in the dielectric layers. The die RDL 108 is formed over the side of the substrate having the active devices, with the conductive elements 110 connecting to the active devices on the die substrate 106.

The wafer 104 has a wafer RDL 114 disposed over a wafer substrate 112. In some embodiments, the wafer substrate 112 is a semiconductor with one or more active devices formed therein. The wafer RDL 114 is formed over the active devices in the wafer substrate 112 and has one or more conductive elements 110 disposed in dielectric layers.

Figure 2:
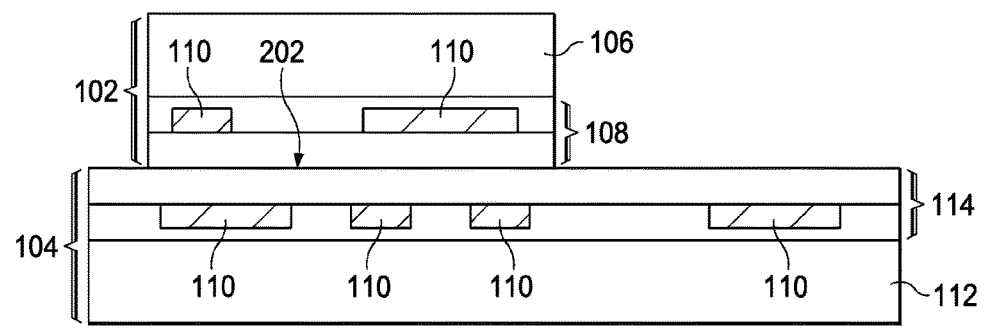

FIG. 2 illustrates a cross-sectional view of a processing step for bonding a wafer according to an embodiment. The die 102 and wafer 104 are bonded at the top surfaces of the RDLs 108 and 114, forming a bond interface 202. The die 102 and wafer 104 are used as the basis for a package having connections for mounting the package to external devices, substrates, or the like. In some embodiments, the die 102 is bonded to the wafer 104 by, for example, direct surface bonding, metal-to-metal bonding, hybrid bonding, or another bonding process. A direct surface bonding process creates an oxide-to-oxide bond or substrate-to-substrate bond through a cleaning and/or surface activation process followed by applying pressure, heat and/or other bonding process steps to the joined surfaces. In some embodiments, the die 102 and wafer 104 are bonded by metal-to-metal bonding that is achieved by fusing conductive elements 110, such as metal bond pads, exposed at the surfaces of the RDLs 108 and 114. In other embodiments, hybrid bonding is used to bond the die 102 and wafer 104 by a combination of direct surface bonding and metal-to-metal bonding, where both the surfaces of the RDLs 108 and 114 and the surfaces of metal bond pads exposed at the surfaces of the RDLs 108 and 114 are bonded. In some embodiments, the bonded dies are baked, annealed, pressed, or otherwise treated to strengthen or finalize the bond.

Figure 3:
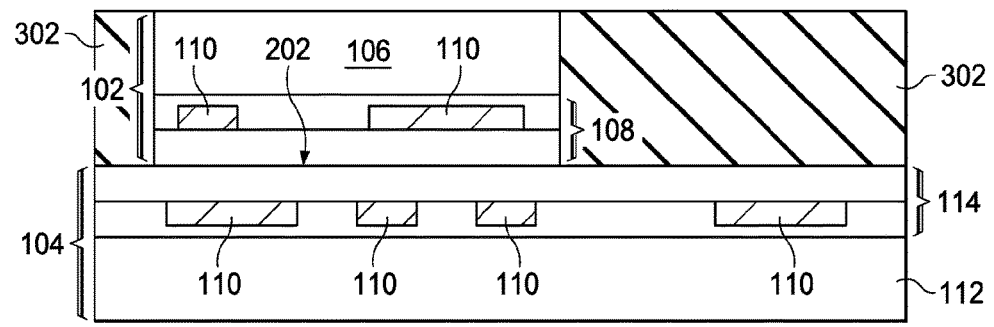

FIG. 3 is a cross-sectional view of forming molding compound 302 over the package according to an embodiment. The molding compound 302 is formed around the die 102 and on the wafer RDL 114. In some embodiments, the molding compound 302 is shaped or molded using for example, a mold (not shown) which may have a border or other feature for retaining molding compound 302 when applied. Such a mold may be used to pressure mold the molding compound 302 around the die 102 to force the molding compound 302 into openings and recesses, eliminating air pockets or the like in the molding compound 302. In an embodiment, the molding compound 302 is a nonconductive or dielectric material, such as an epoxy, a resin, a moldable polymer such as PBO, or another moldable material. For example, molding compound 302 is an epoxy or resin that is cured through a chemical reaction or by drying. In another embodiment, the molding compound 302 is an ultraviolet (UV) cured polymer. In other embodiments, a dielectric or insulating film comprising an oxide, nitride, or the like is formed over the package. In such embodiments, the molding compound 302 is replaced by the insulating film. However for the sake of brevity, embodiments of the molding compound 302 are referred to herein as comprising the dielectric or insulating film. In some embodiments, the oxide or nitride insulating film is a silicon nitride, silicon oxide, silicon oxynitride, or another dielectric material, and is formed by chemical vapor deposition (CVD), plasma enhanced CVD (PECVD) or another process.

After the molding compound 302 is formed over the die 102 and wafer 104, the molding compound 302 is reduced or planarized by, for example, grinding, a chemical-mechanical polish (CMP), etching or another process. For example, where the molding compound 302 is an insulating film such as an oxide or a nitride, a dry etch or CMP is used to reduce or planarize the top surface of the molding compound 302. In some embodiments, the molding compound 302 extends over the die 102 after planarization, and in other embodiments, the molding compound 302 is reduced so that the die 102 is exposed with a top surface substantially planar with the top surface of the molding compound 302. The die substrate 106 is, in some embodiment, thinned or reduced in the same process as the molding compound, resulting in a die 102 backside surface that is substantially planar with the molding compound surface.

Figure 4:
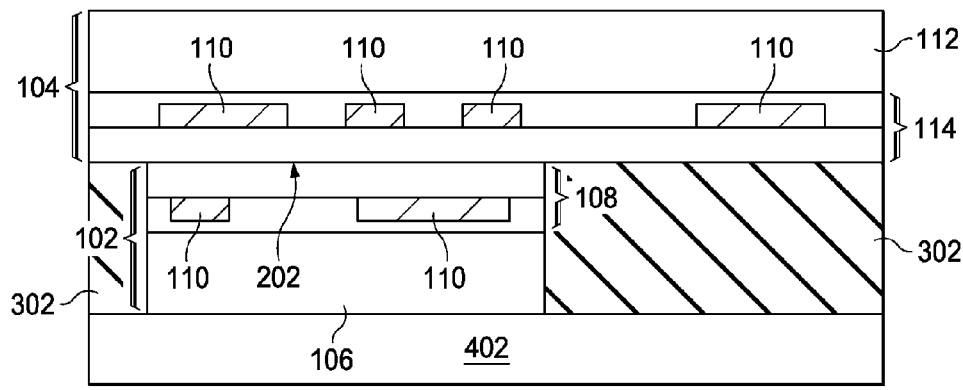

FIG. 4 is a cross-sectional view of mounting the package to a carrier 402 according to an embodiment. The package is inverted to permit access to, and processing through the wafer substrate 112. The die 102 and molding compound 302 surface are bonded to, for example, a glass carrier, or other handling substrate. The package is attached to the carrier 402 using die attachment film (DAF), an adhesive, or the like. In other embodiments, the package is attached to the carrier 402 with the wafer substrate 112 on the carrier 402, permitting processing of the package through the die side of the package. In some embodiments, the wafer substrate 112 is also thinned or reduced by grinding, CMP, etching or another process.

Figure 5:
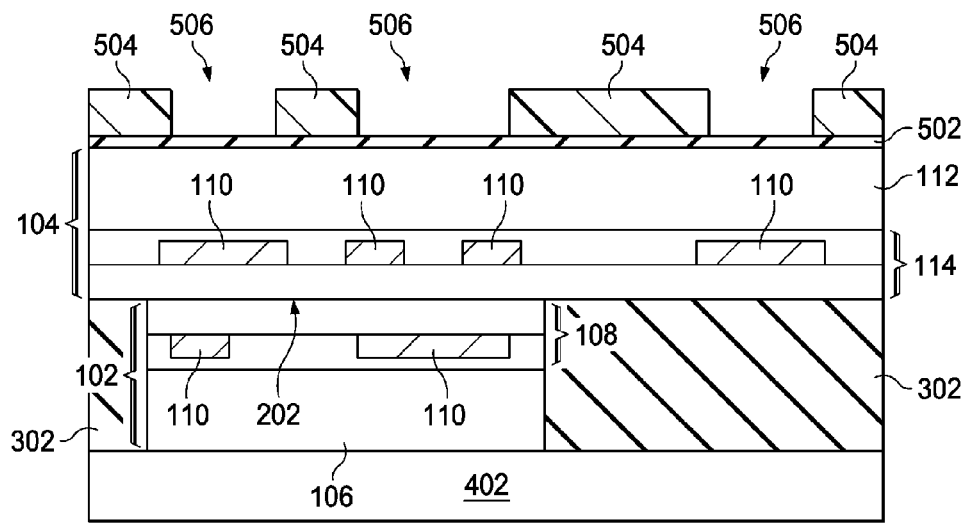

FIG. 5 is a cross-sectional view illustrating masking the wafer substrate 112 according to an embodiment. An etch stop layer 502 is formed on the wafer substrate 112, and is formed from a material that has a high etch selectivity compared to the material of the wafer substrate 112. Additionally, the etch stop layer 502 has a high etch selectivity compared to the wafer RDL 114 and die RDL 108. In some embodiments where the wafer substrate 112 is, for example, silicon and the RDLs 114 and 108 are silicon oxide, the etch stop layer 502 is a nitride such as silicon nitride (SiN), a carbide such as silicon carbide (SiC) or an oxynitride such as silicon oxynitride (SiON), or another etch stop material. In such an embodiment, the etch stop layer is deposited by deposited using CVD, PECVD, physical vapor deposition (PVD), epitaxy, a spin-on process, or another deposition process.

A mask 504 is formed over the etch stop layer 502 and is patterned to form openings 506 exposing portions of the etch stop layer 502. The mask 504 is, in some embodiments, a photoresist that is deposited, exposed and developed. The openings 506 in the mask 504 are aligned over conductive elements 110 in the RDLs 108 and 114.

Figure 6:
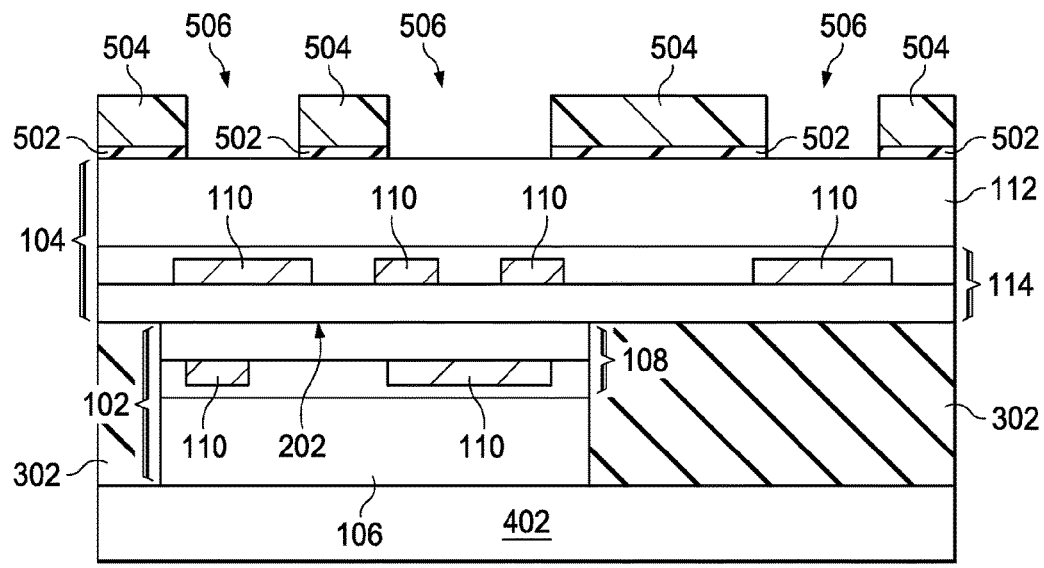

FIG. 6 is a cross-sectional view illustrating etching of the etch stop layer 502 according to an embodiment. The etch stop layer 502 is etched to expose the wafer substrate 112. In some embodiment, the etch stop layer 502 is etched with a dry plasma etch, such as an oxygen or nitrogen plasma with a fluorine based etchant such as carbon tetrafluoride ($CF_4$) or sulfur hexafluoride ($SF_6$). In other embodiments, the etch stop layer 502 is etched by a wet etch, using for example, sulfuric acid ($H_2SO_4$) heated phosphoric acid ($H_3PO_4$), or the like.

Figure 7:
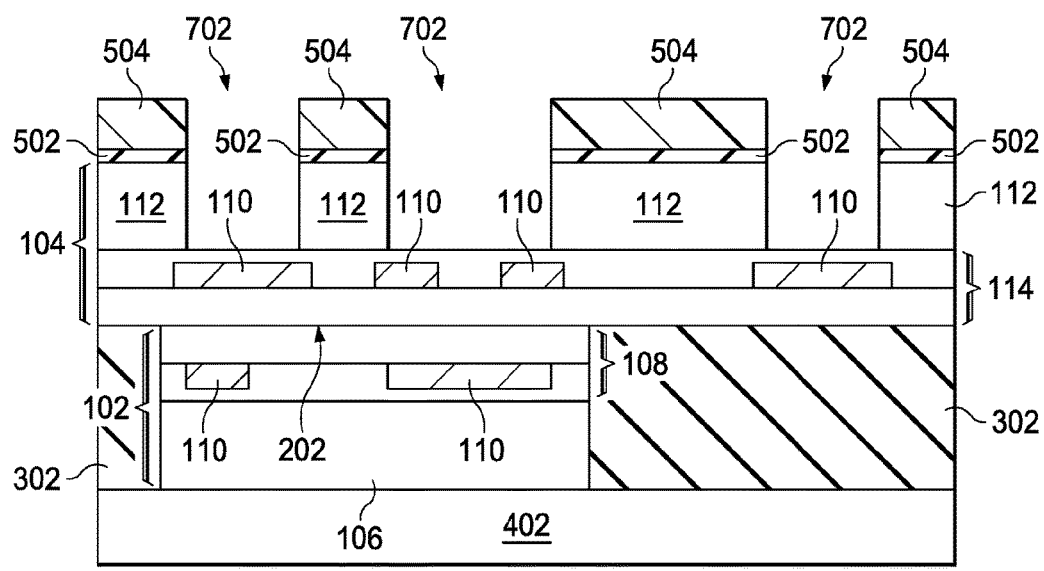

FIG. 7 is a cross-sectional view illustrating etching of the wafer substrate 112 according to an embodiment. The wafer substrate 112 is etched anisotropically to form via openings 702 with substantially vertical walls. In some embodiments, the wafer substrate 112 is etched in a separate process step from etching the etch stop layer 502, permitting the etch stop layer 502 to act as a hard mask for etching the wafer substrate 112. For example, where the wafer substrate 112 is silicon, the wafer substrate 112 is dry plasma etched with a chlorine based etchant, such as gaseous chlorine ($Cl_2$) or wet etched with potassium hydroxide (KOH) or a nitric acid/hydrofluoric acid ($HNO_3$/HF) mix. Additionally, the wafer substrate 112 is selectively etched, with the etch stopping at the wafer RDL 114.

Figure 8:
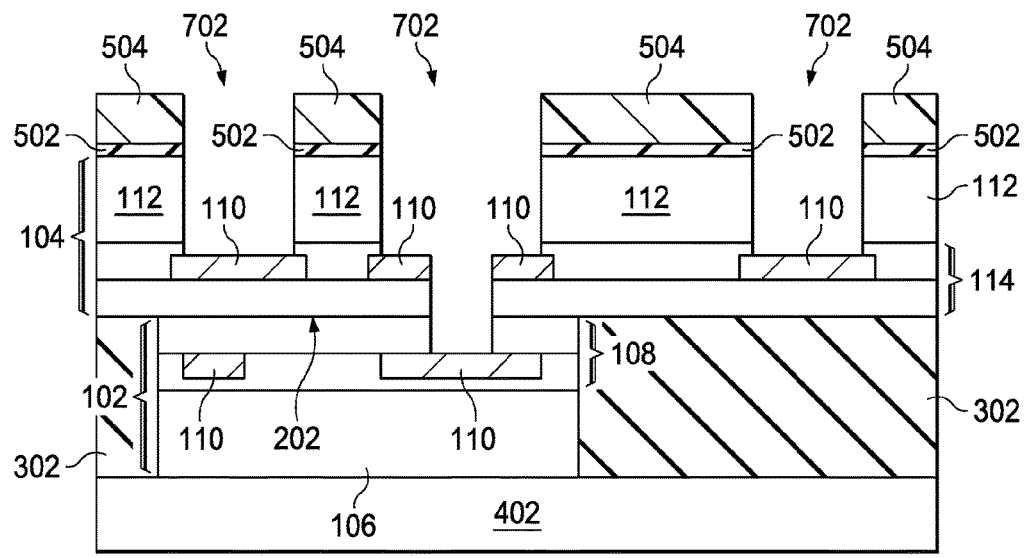

FIG. 8 is a cross-sectional view illustrating etching of the oxide layers of the RDLs 108 and 114. The oxide layers are, in an embodiment, etched using a buffered oxide etch (BOE) comprising ammonium fluoride ($NH_4F$) and hydrofluoric acid. Conductive elements 110 in the oxide layers of the RDLs 108 and 114 act as an etch stop layer, permitting etching of the RDLs 108 and 114 to different depths. Etching the oxide layers extends the via openings 702 to conductive elements 110 in the RDLs 108 and 114. In some embodiments, a via opening 702 extends through an opening in an upper conductive element 110 and exposes a surface of a lower conductive element 110. Thus, a single via opening 702 can expose surfaces of multiple conductive elements 110. Additionally, in some embodiment, the via openings 702 expose conductive elements 110 in the die RDL 108 and the wafer RDL 114.

Figure 9:
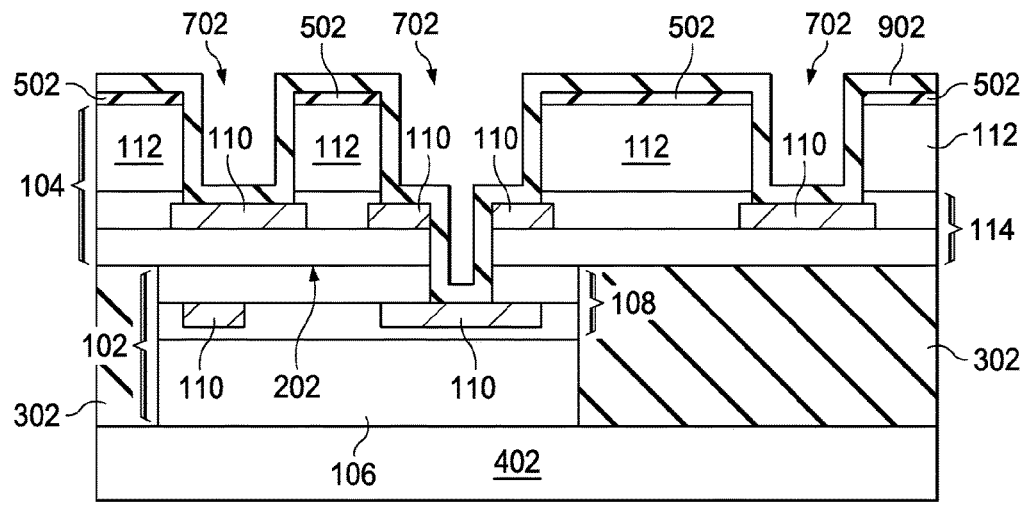

FIG. 9 is a cross-sectional view illustrating formation of an isolation layer 902 according to an embodiment. The mask 504 (see FIG. 7) is removed, and a conformal dielectric isolation layer 902 is formed over the etch stop layer 502. The isolation layer 902 extends into each of the via openings 702 and covers the sidewalls of the via openings 702, including the portions of the wafer substrate 112 exposed in the via openings 702.

In an embodiment, the isolation layer 902 is formed from silicon nitride, for example, using a CVD or PECVD process. In other embodiments, the isolation layer 902 is formed from an oxide, another nitride, a carbide, an oxynitride, spin on glass (SOG) or another dielectric or electrical insulating material. The thickness of the isolation layer 902 is determined, in part, by the intended voltage on vias that will be formed in the via openings 702. It has been determined that a thickness between about 500 angstroms and about 5000 angstroms will provide a thickness that results in a breakdown voltage that is greater than about 3.8 volts.

Figure 10:
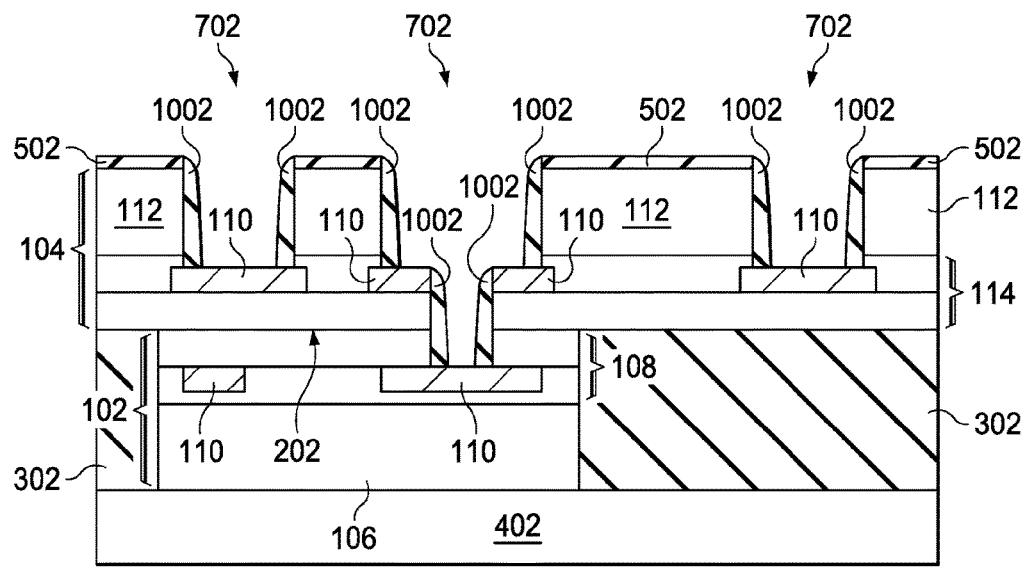

FIG. 10 is a cross-sectional view illustrating formation of self-aligning spacers 1002 according to an embodiment. The isolation layer 902 (see FIG. 9) is etched, using for example, a dry plasma etch with chlorine, sulfur hexafluoride, carbon tetrafluoride, chlorine or another etchant in an argon (Ar), helium (He) or other environment. In some embodiments, the etchant is provided with, for example, oxygen ($O_2$), nitrogen ($N_2$) or other process gasses to increase the selectivity of the etch. In such an etch, the environment is maintained between about 25° C. and about 150° C. at a pressure between about 10 mtorr and about 200 mtorr. In some embodiments, the etch is anisotropic, removing material in a vertical direction. Thus, the etch removes material of the isolation layer 902 from the horizontal surfaces of the package, leaving spacers 1002 on the sidewall surfaces of the package. For example, portions of the isolation layer 902 disposed on the etch stop layer 502 are removed while portions of the isolation layer 902 disposed on the sidewalls of the via openings 702 remain. This is due to the thickness of the isolation layer 902 in the vertical direction being greater where at the sidewalls than at the horizontal surfaces. Additionally, the portions of the top surfaces of the conductive elements 110 are exposed during the etch. This is due to the isolation material being removed substantially from the top direction, as the directional etching of the isolation layer 902 reduces the top surface of the isolation layer 902, eliminating the lateral portions of the isolation layer 902 and leaving the vertical portions.

It has been discovered that self-aligning spacers 1002 can be formed within the via openings 702, and that the self-aligning feature of the spacers 1002 causes the spacers 1002 to form on the sidewalls of the via openings 702. The spacers 1002 insulate the material forming the sidewalls of the via openings 702 from vias formed in the via openings 702. In particular, the spacers 1002 form on the sidewalls of the via openings 702 where the via opening 702 passes through the wafer substrate 112, with the outer surfaces of the spacers 1002 disposed on the sidewalls of the via openings 702, and with the inner surfaces of the spacers 1002 facing the interior of the via openings 702. The spacers 1002 permit a conductive via to be formed in the via opening 702 while avoiding electrical contact with the vertical surfaces of the wafer substrate 112 and RDLs 108 and 114. In some embodiments, the spacers 1002 extend to an underlying conductive feature 110, shielding the via opening 702 from all of the sidewalls of the via openings 702. Additionally, the spacers 1002 leave portions of the lateral surfaces of the conductive elements 110 exposed in the via openings 702 so that a subsequently formed via can come into electrical contact with the conductive elements 110. Thus, some of the spacers extend below the bottommost surface of the wafer substrate 112 into the RDLs 108 and 114, with the inner surfaces of the spacers 1002 extending contiguously from the conductive element 1002 to the top surface of the wafer substrate 112, or over the top surface of the wafer substrate.

In some embodiments where a via opening 702 is formed over or through an upper conductive element 110 to a lower conductive element 110, the via opening 702 has an upper portion with a wider width than a lower portion of the via opening 702. In such an embodiment, separate spacers 1002 are formed on the sidewalls of the upper and lower portions of the via openings 702, with the upper and lower spacer 1002 laterally spaced apart to expose the lateral surfaces of the upper conductive element 110.

Figure 11:
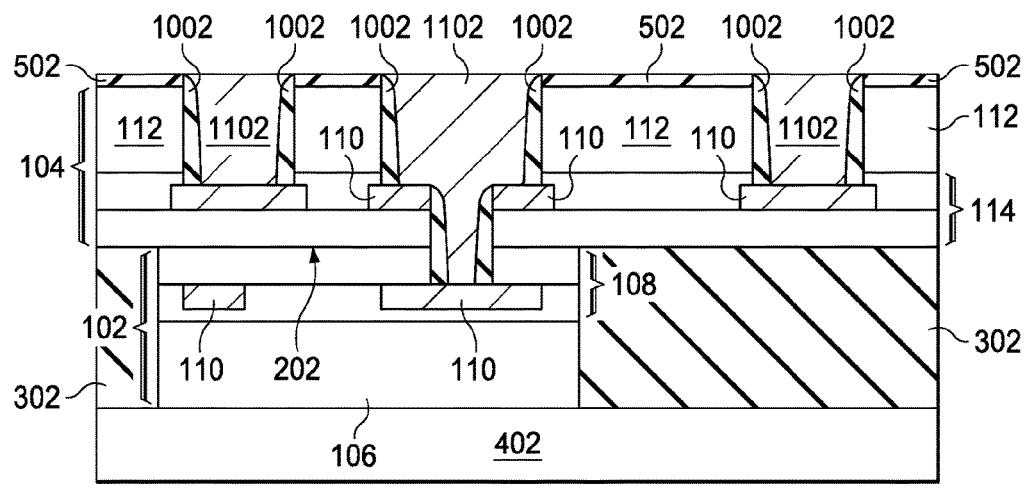

FIG. 11 is a cross-sectional view illustrating formation of vias 1102 in the via openings 702 according to an embodiment. As the vias 1102 are formed after bonding the die 102 to the wafer 104, this process is referred to as a via last process. In some embodiments, vias 1102 that extend through a substrate such as the wafer substrate 112 are referred to as through substrate vias (TSVs) or alternatively, as through silicon vias for vias extending though a silicon substrate. Vias 702 that extend through the molding compound 302 are referred to as through dielectric vias (TDVs).

In some embodiments, a barrier layer (not shown for clarity) is formed in the via openings 702, with the barrier layer formed from, for example, cobalt (Co), tantalum, tungsten, tantalum nitride (TaN), titanium nitride (TiN), or the like by CVD, PECVD or another deposition process. Vias 1102 are created by filling the via openings 702 with a conductive material such as copper (Cu) aluminum (Al), aluminum copper alloy (AlCu), gold, titanium, cobalt, an alloy, or another conductive material. In some embodiments, the vias are formed through, for example, electrochemical plating (ECP), electroplating, electroless plating or another process. In such embodiments, a seed layer (not shown) is formed over the barrier layer or over the spacers and conductive elements 110 by for example, atomic layer deposition. The seed layer provides nucleation sites for the plating process and increases the uniformity of the plated material that forms the vias 1102. In some embodiments, the conductive material of the vias 1102 extends over the via openings 702. Such overfilling is used, for example, to ensure that the openings 702 are completely filled. Excess material is removed by grinding, CMP, polishing, etching or another reduction process. After formation of the vias 1102, the top surfaces of the vias 1102 are substantially planar with the top surface of the etch stop layer 502. In some embodiments, the grinding process removes the etch stop layer 502 or reduces the top surface of the wafer substrate 112.

The vias 1102 extend through the wafer substrate 112 to contact one or more conductive elements 110. The spacers 1002 electrically insulate the vias 1102 from the wafer substrate 112 so that electrical signals sent through the vias 1102 do not interfere with active devices in the wafer substrate 112. In some embodiments, a via 1102 extends through the wafer substrate 112, the wafer RDL 114, and bond interface 202 to contact a conductive element 110 in the die RDL 108. In such an embodiment, the conductive element 110 on the die RDL 108 is electrically connected to the die substrate 106 through the die RDL 108. Thus, a connection between the die substrate 106 and an external device or connection may be formed from the wafer side of the package. Similarly, in some embodiments, a via 1102 extends through the wafer substrate 112 and contacts a conductive element 110 in the wafer RDL 114 that is electrically connected to the wafer substrate 112. Thus, power or data connections can be provided from the die 102 or wafer 104 through the wafer substrate 112 to an external device.

Additionally, in some embodiments, the wafer 104 can be electrically connected to the die 102 using the via last process. For example, a first conductive element 110 in the wafer RDL 114 and a second conductive element 110 in the die RDL 108 can be connected by a via 1102 that contacts both the first and second conductive elements 110. Thus, even though the RDLs 108 and 114 are between the die 102 and wafer 104, external electrical connectivity and die-to-wafer connectivity can be provided without discrete connectors such as microbumps or solder balls formed prior to bonding the die 102 to the wafer 104. Additionally, the via last process eliminates the requirements for aligning the wafer to the die during the die-to-wafer bonding process.

It has been discovered that the spacers 1002 provide a lower cost and simpler structure for chip-on-wafer structures. Additionally, the spacers 1002 permit a height-to-width aspect ratio for the vias that is between 3 and about 10, increasing the density of inter-chip connections. It has been further discovered that, with the vias 1102 extending through the wafer substrate 112, the vias 1102 can be arranged through the package more regularly and provide a more heterogeneous chip stack. The regular arrangement of the vias 1102 also provides improved warpage control during subsequent processing or package mounting.

Figure 12:
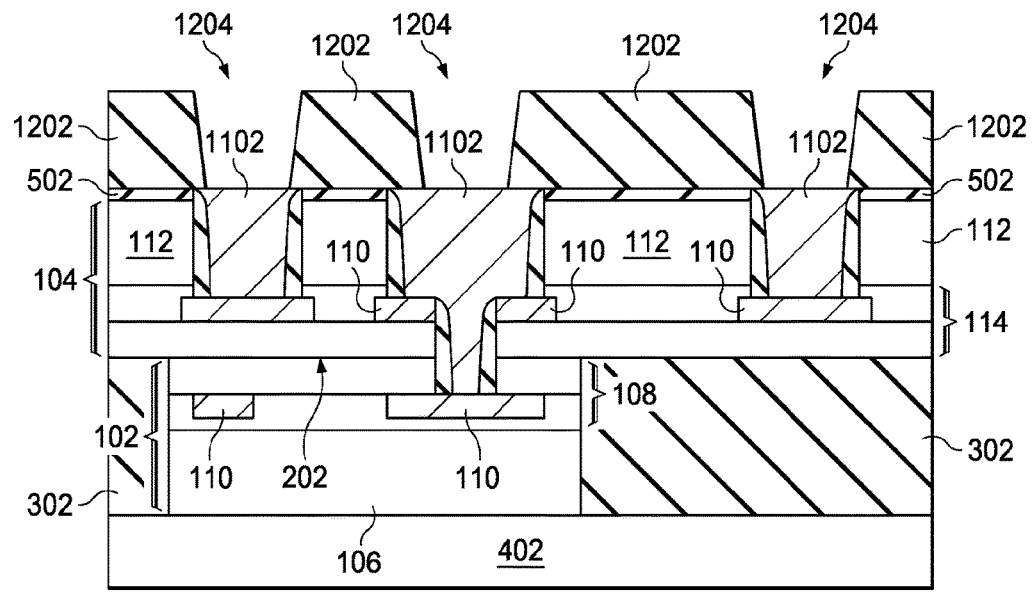

FIG. 12 is a cross-sectional view illustrating a top RDL insulating layer 1202. In some embodiments, an insulating material such as PBO, silicon oxide, polyimide, or another insulating material is formed over the etch stop layer 502. One or more RDL openings 1204 are formed in the insulating layer 1202 exposing the vias 1102. In some embodiment, insulating layer 1202 is PBO that is sprayed on or spun on, and the RDL openings 1204 are formed by exposing and developing the PBO with a photolithographic process. In other embodiments, the insulating layer 1202 is deposited by CVD or the like and etched, laser drilled, milled, or otherwise patterned.

Figure 13:
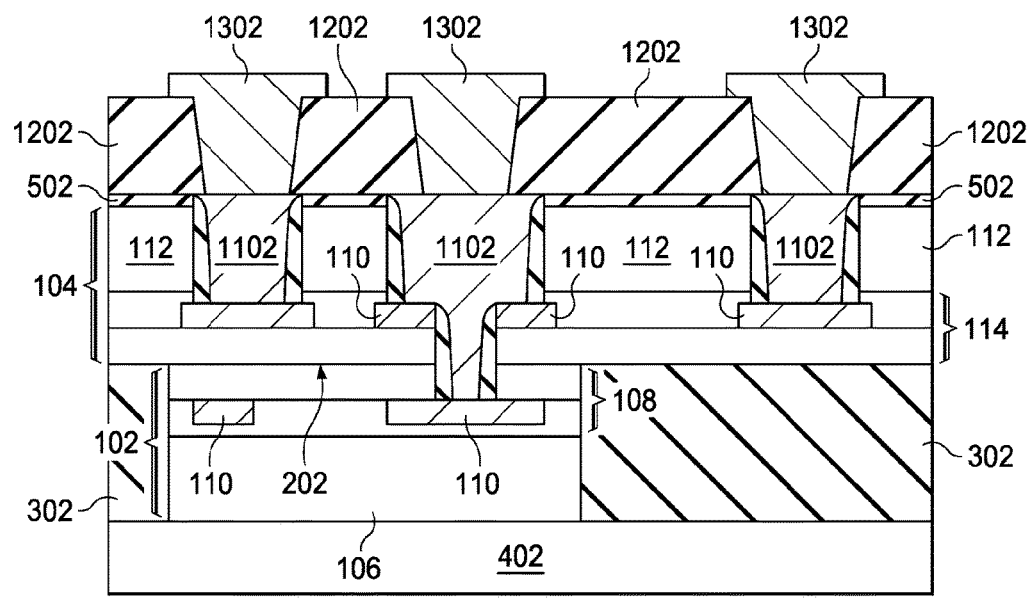

FIG. 13 is a cross-sectional view illustrating formation of top RDL conductive elements 1302 in the top RDL insulating layer 1202 according to an embodiment. A conductive material, such as copper, is deposited over the insulating layer 1202 in the RDL openings 1204 through, for example, sputtering, PVD, CVD, plating or another deposition process. The deposited conductive material is patterned by masking and etching or by masking prior to deposition. While the illustrated top RDL conductive elements 1302 are shown extending substantially vertically for clarity, it should be understood that in some embodiments, the top RDL conductive elements 1302 have portions that extend laterally to provide a desired layout for subsequently formed layers or connectors.

Figure 14:
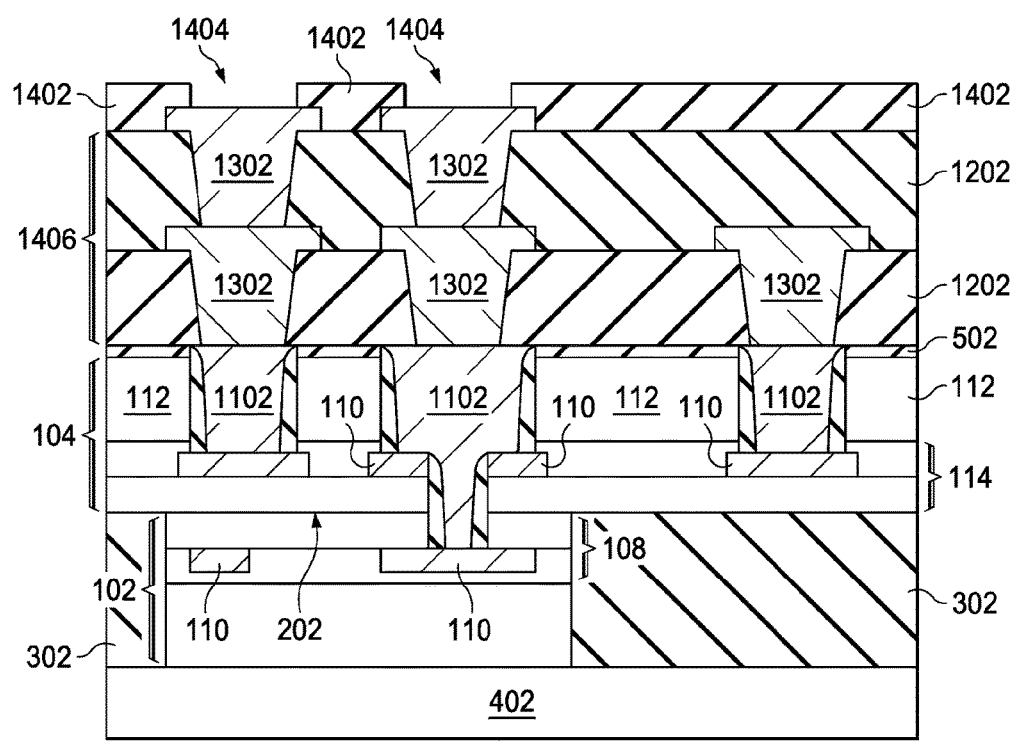

FIG. 14 is a cross-sectional view illustrating formation of additional insulating layers and conductive elements to form the top RDL 1406. One or more top RDL insulating layers 1202 with conductive elements 1302 are formed in a stack to provide electrical connectivity between external devices and the vias 1102. Additionally, a protective layer 1402 is formed over the uppermost top RDL insulating layer 1202 and has openings exposing the top RDL conductive elements 1302. In some embodiments, the protective layer 1402 is PBO, an epoxy, an oxide, a nitride, a carbide, an oxynitride, a polyimide, or another insulating or protective material and is deposited and patterned as described above.

Figure 15:
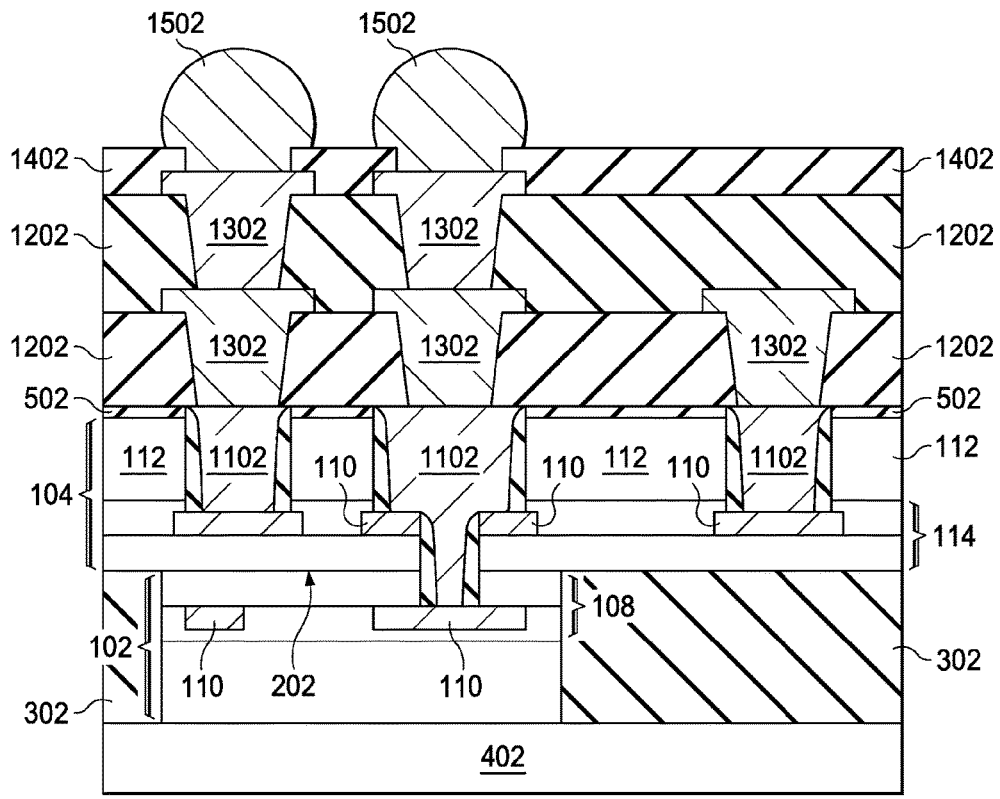

FIG. 15 is a cross-sectional view illustrating formation of connectors 1502 according to an embodiment. One or more connectors 1502 are mounted on exposed portions of the top RDL conductive elements 1302. In some embodiments, the connectors 1502 are solder balls, pillars, conductive bumps or another conductive connector. The connectors 1502 are configured to permit mounting of the package to a target substrate such as a die, package, wafer, PCB or the like. Thus, the wafer 104 and die 102 would be in signal connectivity with the target substrate though the connectors 1502 and vias 1102. The carrier 402 then removed from the package.

While the chip-on-wafer package is shown using the via last process to form vias 1102 that extend from the wafer side of the package through the wafer substrate 112 to the RDLs 108 and 114, it should be understood that the disclosed embodiments are not limited to such an arrangement. In other embodiments, vias 1102 are formed from the die side of the package through the die substrate 106 and molding compound 302 to the RDLs 108 and 114. Additionally, in some embodiments, the vias 1102 are formed from both the wafer side and die side of the package.

Additionally, the embodiments disclosed above are not limited to the order of steps and structure described above. FIGS. 16 through 20 illustrate cross-sectional views of intermediate processing steps in forming a ship-on-wafer structure having partial height self-aligning spacers according to an embodiment.

Figure 16:
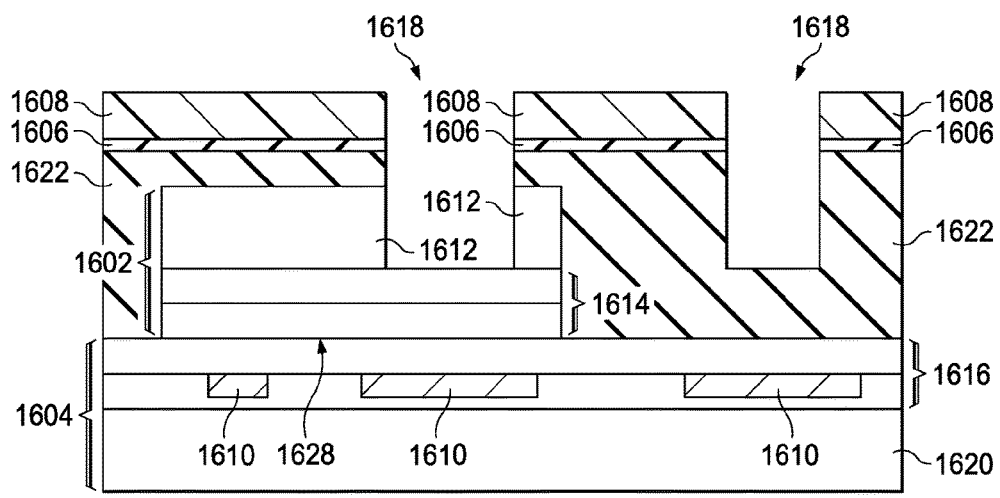
FIGS. 16-20 illustrate cross-sectional views of intermediate processing steps in forming a chip-on-wafer structure using via last process according to another embodiment.

FIG. 16 illustrates a cross-sectional view of masking and etching via openings 1618 in a molding compound 1622 of a package according to an embodiment. A die 1602 and wafer 1604 are bonded, for example, as described above. The die 1602 and wafer 1604 have a die substrate 1612 and wafer substrate 1620, respectively, and the substrates 1612 and 1620 have one or more active devices. A die RDL 1614 and wafer RDL 1616 are disposed on the respective substrates 1612 and 1620 and comprise dielectric layers with conductive elements 1610 disposed therein, some of which are in contact with the active devices in the respective substrates 1612 and 1620. The die 1602 and wafer 1604 are bonded together so that the die RDL 1614 and wafer RDL 1616 are in contact and form a bond interface 1628. In some embodiments, the die 1602 and wafer 1604 are bonded with a direct surface, metal-to-metal or hybrid bond as described above. The molding compound 1622 is formed over the die 1602, and in some embodiments, extends over the die 1602. An etch stop layer 1606 is formed over the molding compound 1622.

A mask 1608 is deposited over the etch stop layer 1606 and patterned with openings disposed over one or more of the conductive elements 1610. Via openings 1618 are etched through the molding compound 1622 using the mask 1608 to control the location of the via openings 1618. In an embodiment, the via openings 1618 extend through the molding compound 1622, and via openings 1618 disposed over the die substrate 1612 extend through the die substrate 1612 to the die RDL 1614. The via openings 1618 that are adjacent to, and not disposed over, the die substrate 1612 extend partially through the molding compound 1622.

Figure 17:
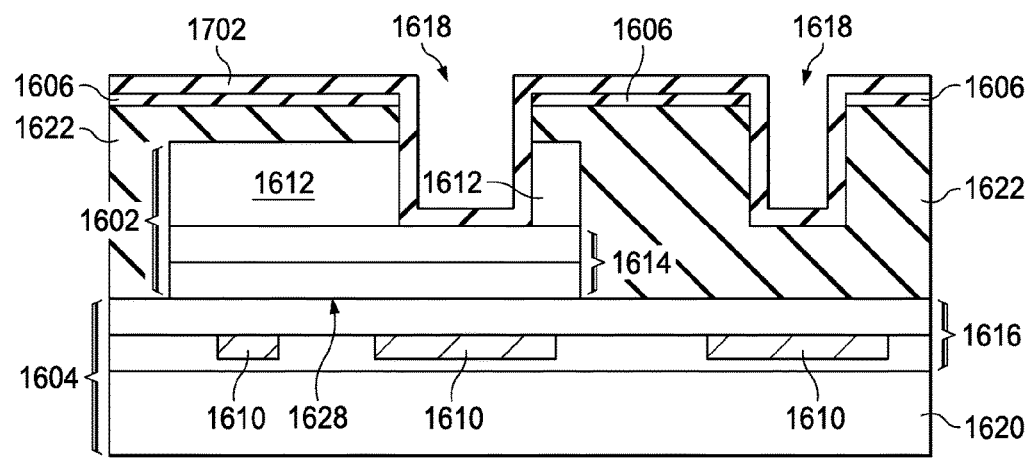

FIG. 17 is a cross-sectional view illustrating formation of an isolation layer 1702 according to an embodiment. The mask 1608 (see FIG. 16) is removed, and a conformal dielectric isolation layer 1702 is formed over the etch stop layer 1606. In an embodiment, the isolation layer 1702 is formed as described above. The isolation layer 1702 extends into each of the via openings 1618 and covers the sidewalls of the via openings 1618, including the portions of the die substrate 1612 exposed in the via openings 1618. Additionally, the isolation layer 1702 covers the lateral surfaces of, for example, the die RDL 1614 and the molding compound 1622 that are exposed at the bottoms of the openings 1618.

Figure 18:
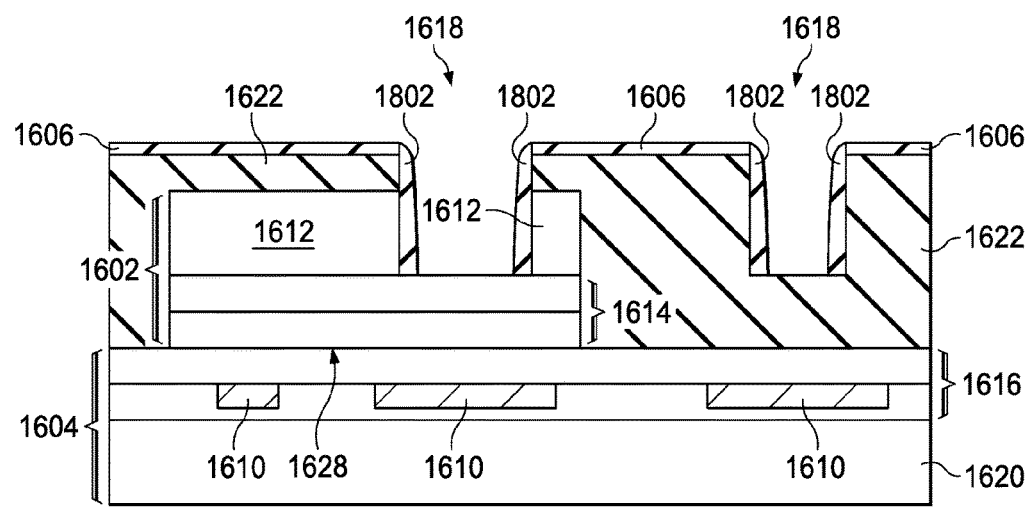

FIG. 18 is a cross-sectional view illustrating formation of partial height self-aligning spacers 1802 according to an embodiment. The isolation layer 1702 (see FIG. 17) is etched, in some embodiments, as described above. The etch exposes portions of the lateral surfaces of the die RDL 1614 in the via openings 1618 between the spacers 1802. Additionally, for the via openings 1618 that are adjacent to, and not disposed over, the die RDL 1616, the etch exposes the molding compound 1622 surface that forms the bottom of the via openings 1618.

Figure 19:
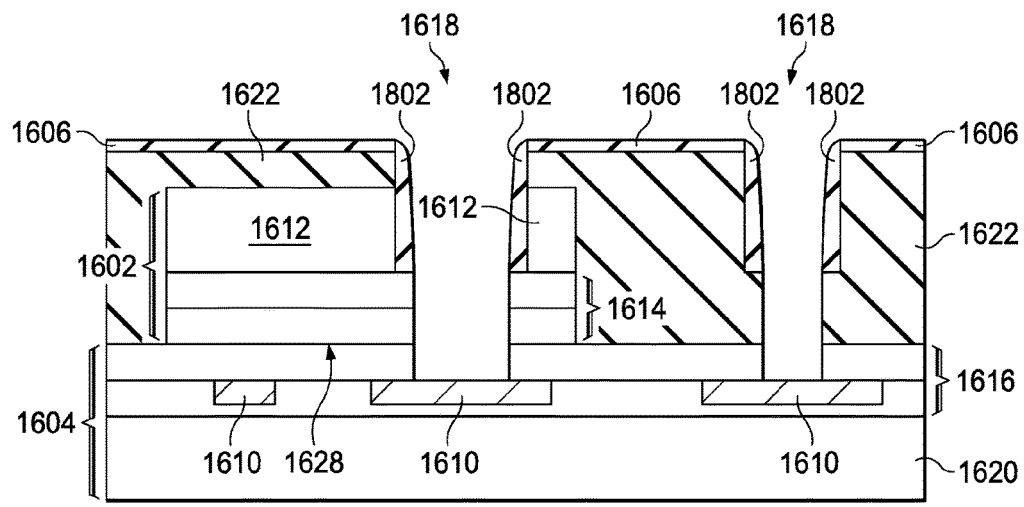

FIG. 19 illustrates a cross-sectional view of a second etch after formation of the spacers 1802 according to an embodiment. In some embodiments, the isolation layer 1702 a selectively etched as described above with respect to FIG. 8. The via openings 1618 are extended to underlying conductive elements 1610 in the RDLs 1614 and 1616, exposing an upper surface of the conductive elements 1610. In such an embodiment, the spacers 1802 extend only partially through the via openings 1618, with bottom surfaces of the spacers 1802 disposed on the die RDL 1614 or within the molding compound 1622. However, the spacers 1802 are disposed in the via openings 1618 on the sidewalls of the die substrate 1612, electrically insulating the die substrate 1612 from the via openings 1618 and subsequently formed vias. It has been discovered that the partial height self-aligning spacers 1802 permit etching of both the die RDL and the RDLs 1614 and 1616 with a single mask. The spacers 1802 mask the sidewalls of the die RDL 1614 during the second etch. The resulting via openings 1618 have a lower portion with sidewalls that are substantially planar, level, even or aligned with the inner surfaces of the spacers 1802. In some embodiments where the molding compound 1622 extends over the top surface of the die substrate 1012, the spacers 1802 extend from about the bottom surface of the die substrate 1612 to, or above, the top surface of the molding compound 1622.

Figure 20:
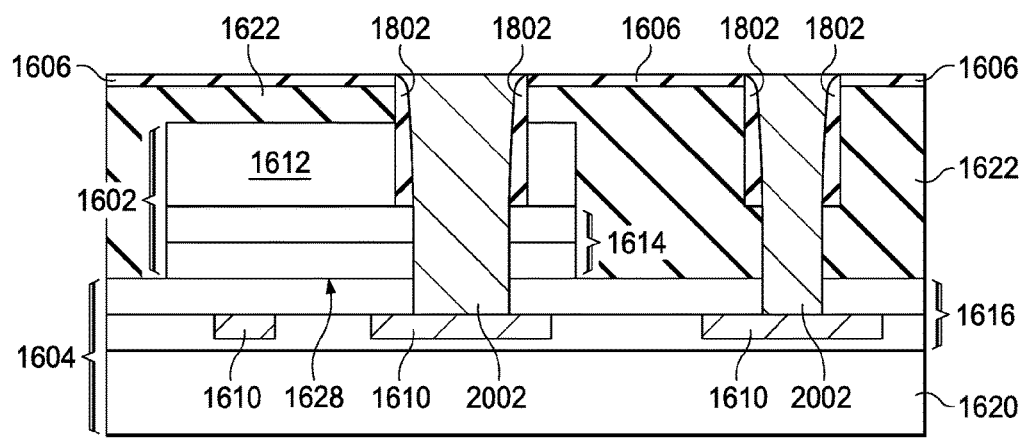

FIG. 20 illustrates a cross-sectional view of formation of the vias 2002 according to an embodiment. In some embodiments, vias 2002 are formed in the via openings 1618 (see FIG. 17) as describe above with respect to FIG. 11. The vias 2002 are insulated from the die substrate 1612 by the spacers 1802, and extend from the top surface of the package through the die substrate 1612 to conductive elements 1610 in the RDLs 1614 and 1616.

While the described embodiments is illustrated as having a partial height spacer 1802 insulating the vias 2002 from the die substrate 1612, the embodiments are not limited to those described. For example, in some embodiments, the partial height spacers 1802 are disposed in the wafer substrate 1620, with the vias 2002 extending to the RDLs 1614 and 1616 from the wafer side of the package.

Figure 21:
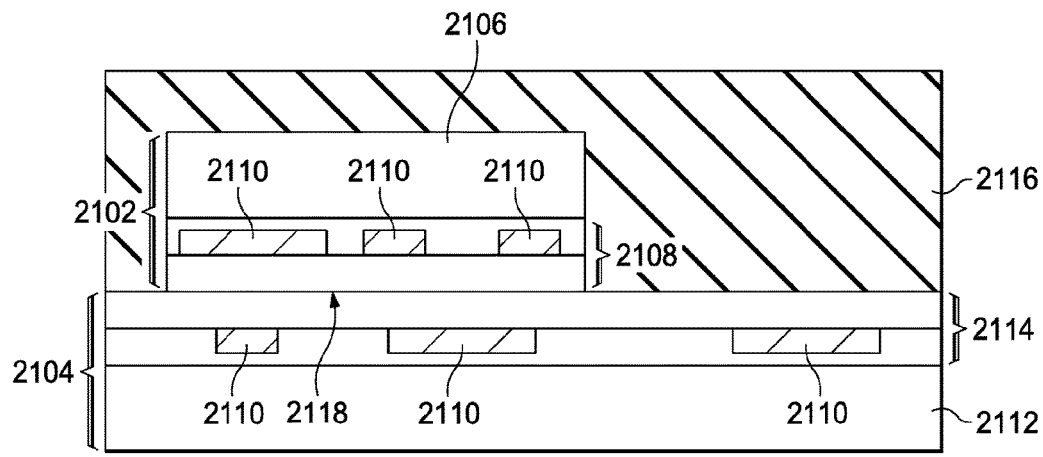
FIGS. 21-30 illustrate cross-sectional views of intermediate processing steps in forming a chip-on-wafer structure using a dual damascene via last process according to an embodiment.

FIGS. 21 through 30 illustrate cross-sectional views of intermediate processing steps in forming a chip-on-wafer structure using a dual damascene via last process according to an embodiment. FIG. 21 illustrates a cross-sectional view of formation of a molding compound 2116 over a die 2102 bonded to a wafer 2104 according to an embodiment. The die 2102 and wafer 2104 have, respectively, a die substrate 2106 and wafer substrate 2112 having one or more active devices. A die RDL 2108 and wafer RDL 2114 are disposed on the respective substrates 2106 and 2112 and comprise dielectric layers with conductive elements 2110 disposed therein, some of which are in contact with the active devices in the respective substrates 2106 and 2112. The die 2102 and wafer 2104 are bonded as described above so that the die RDL 2108 and wafer RDL 2114 are in contact and form a bond interface 2118. The molding compound 2116 is formed over the die 2102 and wafer 2104 as described above, and in some embodiments, extends over the die 2102.

Figure 22:
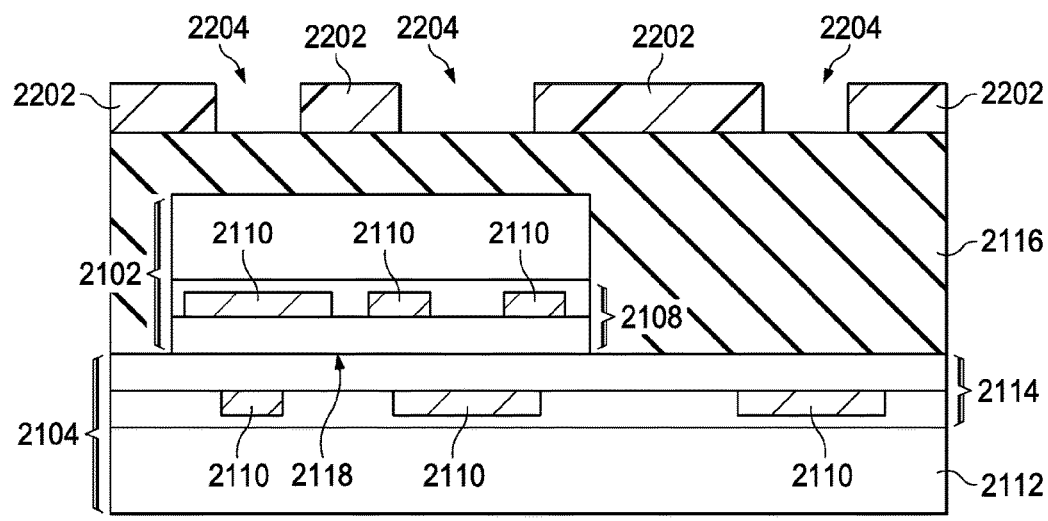

FIG. 22 illustrates a cross-sectional view of forming a first mask 2202 on the package according to an embodiment. In such an embodiment, the first mask 2202 is formed over the molding compound 2116 and is patterned to form openings 2204. The first mask 2202 is, in some embodiments, a photoresist that is deposited, exposed and developed. The openings 2204 in the first mask 2202 are aligned over conductive elements 2110 in the RDLs 2108 and 2114. It has been discovered that a dual damascene technique for forming via openings permits the elimination of an etch stop layer and associated etch of the etch stop layer. In such an embodiment, the first mask 2202 is disposed on the molding compound 2116.

Figure 23:
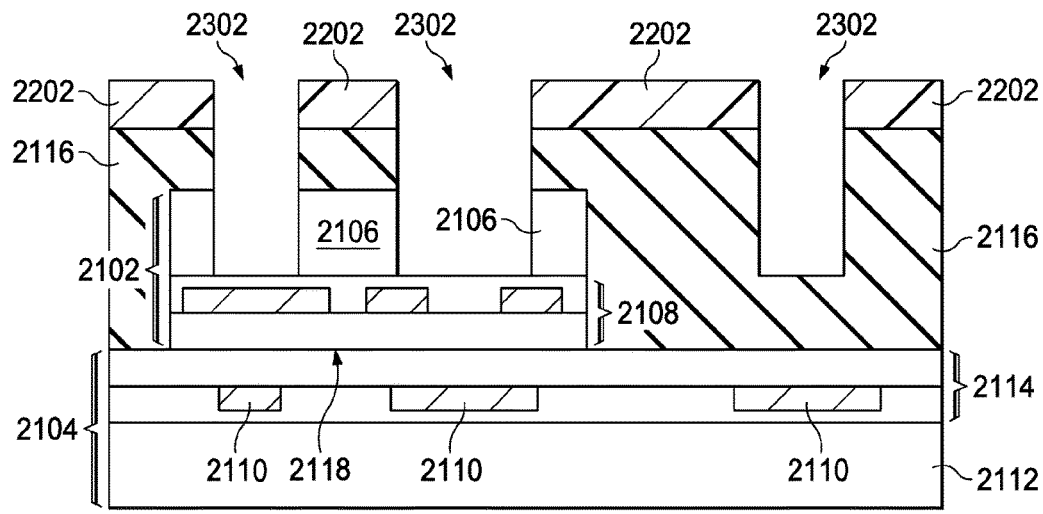

FIG. 23 illustrates a cross-sectional view of etching the die substrate 2106 according to an embodiment. Via openings 2302 are formed through the molding compound 2116, and through the die substrate 2106 to expose the die RDL 2108. In an embodiment, the via openings 2302 are etched as described above. Via openings 2302 that are adjacent to, and not disposed over, the die substrate 2106 extend partially through the molding compound 2116.

Figure 24:
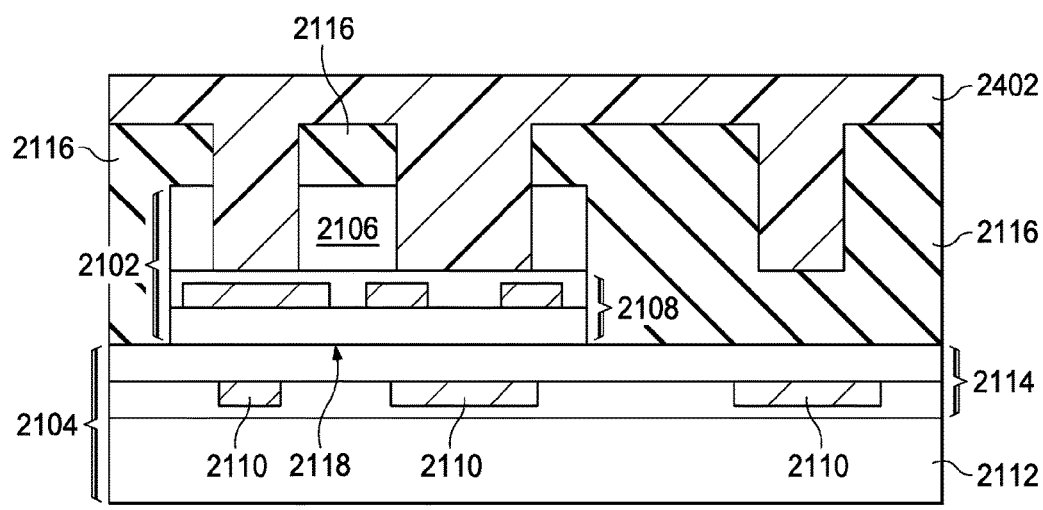

FIG. 24 illustrates a cross-sectional view of application of a second mask 2402 according to an embodiment. In some embodiments, after the first etch of the via openings 2302 through the die substrate 2106, the first mask 2202 is removed. A second mask 2402 is formed over the substrate extends into the via openings 2302. In some embodiments, the second mask 2402 is a photoresist deposited, by for example, spin coating, spray coating, or the like.

Figure 25:
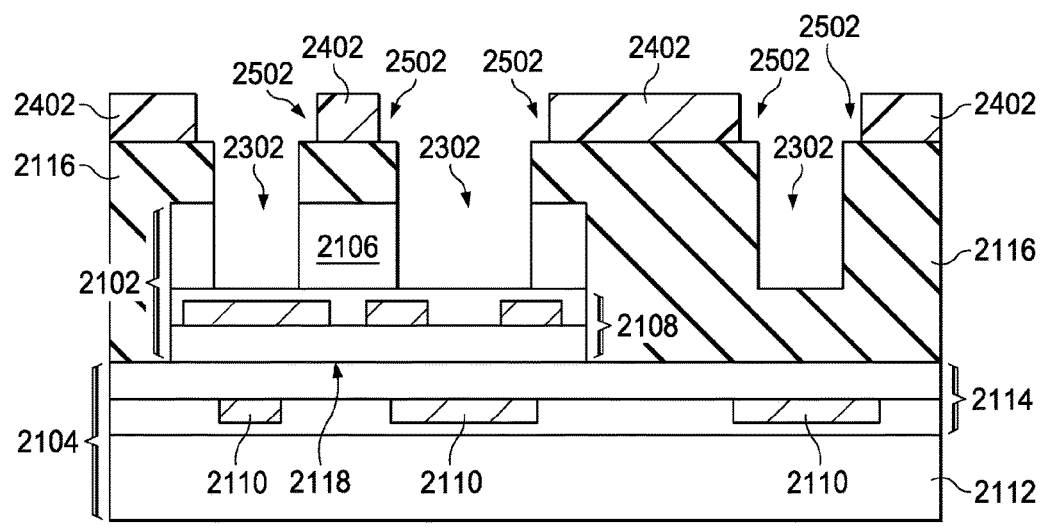

FIG. 25 illustrates a cross-sectional view of patterning the second mask 2402 according to an embodiment. In some embodiments, the second mask 2402 is exposed and developed to pattern the second mask 2402 with second mask openings 2502. In some embodiments, the second mask openings 2502 are wider than the via openings 2302 after the first etch, with the second mask openings 2502 disposed over the via openings 2302. Additionally, in some embodiments, the second mask openings 2502 define openings for metal lines that extend laterally from the via openings to provide electrical connectivity to vias subsequently formed in lower portions of the via openings 2302.

Figure 26:
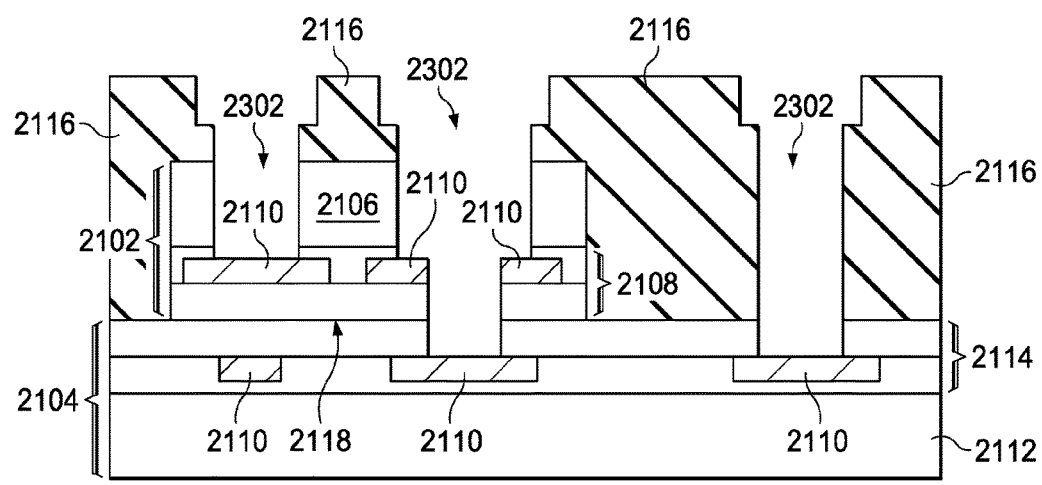

FIG. 26 illustrates a cross-sectional view of etching the RDLs 2108 and 2114 according to an embodiment. The RDLs 2108 and 2114 are etched and the second mask 2402 is removed. In some embodiments, a time mode etch process is used so that the etching process etches a predetermined depth. Etching with the second mask results in upper portions of the via openings 2302 having a width wider than the lower portions of the via openings 2302. The time mode etch controls the depth of the upper portions of the via openings 2302, and results in the lower portions of the via openings 2302 being extended downward to expose the underlying conductive elements 2110.

Figure 27:
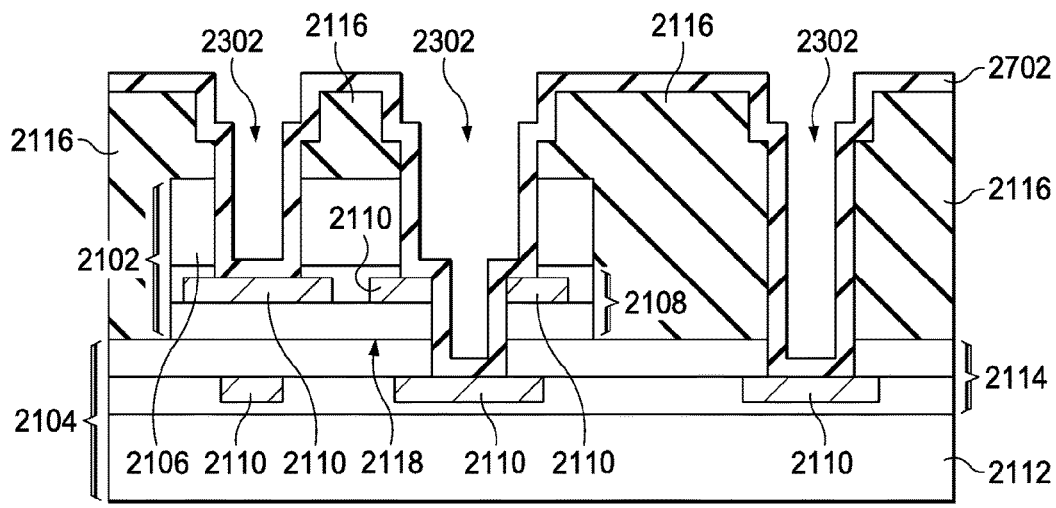

FIG. 27 is a cross-sectional view illustrating formation of an isolation layer 2702 according to an embodiment. A conformal dielectric isolation layer 2702 is formed over the molding compound 2116 and extends into the via openings 2302. In an embodiment, the isolation layer 2702 is formed as described above. The isolation layer 2702 extends into each of the via openings 2308 and covers the sidewalls of the via openings 2308, including the portions of the die substrate 2106 exposed in the via openings 2302.

Figure 28:
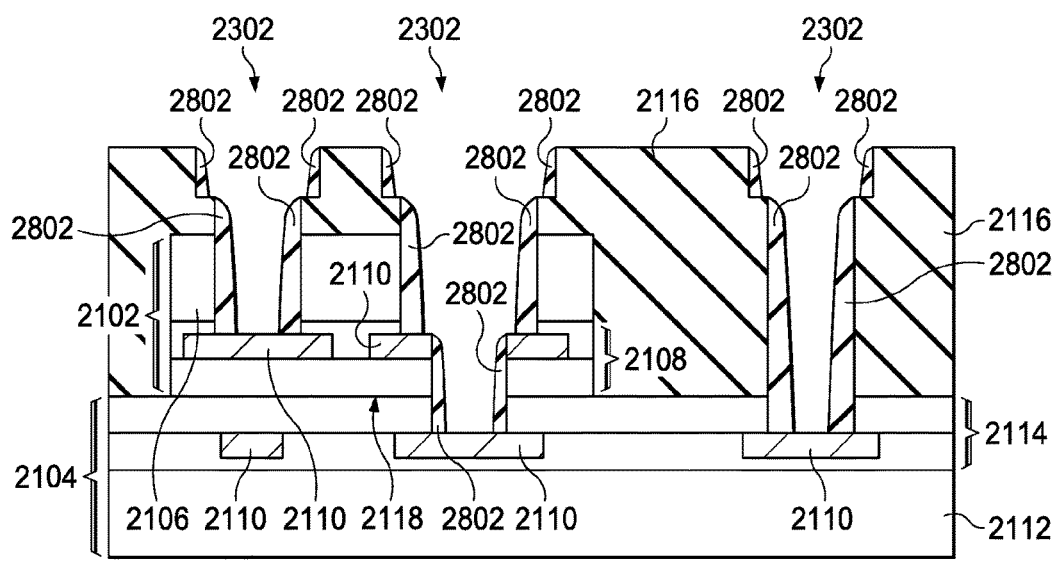

FIG. 28 is a cross-sectional view illustrating formation of self-aligning spacers 2802 according to an embodiment. In some embodiments, the isolation layer 2702 (see FIG. 27) is etched as described above, removing the lateral portions of the isolation layer 2702 and leaving the spacers 2802 on the sidewalls of the via openings 2302. The spacers 2802 insulate the die substrate 2106 from the via openings 2302 and expose portions of the top surfaces of the conductive elements 2110. In some dual damascene embodiments, separate spacers 2802 are formed in the upper and lower portions of the via openings 2302, with the upper and lower spacers 2802 laterally separated from each other and exposing a lateral surface of the molding compound 2116. Additionally, the lower spacers 2802 extend from conductive elements 2110 in the RDLs 2108 and 2114 above the die substrate 2106 into the molding compound 2116.

Figure 29:
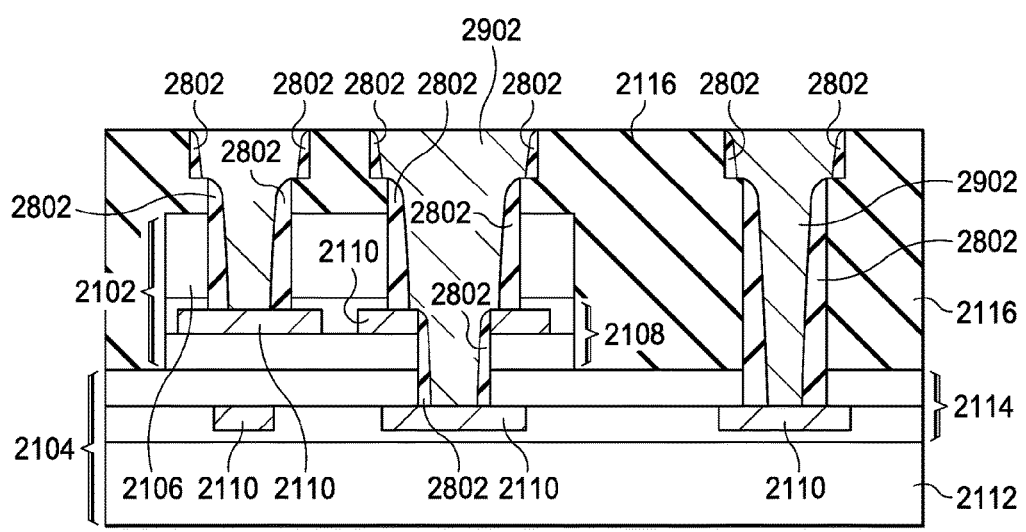

FIG. 29 is a cross-sectional view illustrating formation of vias 2902 in the via openings 702 according to an embodiment. In some embodiments, the vias 2902 are formed as described above. The vias 2902 are insulated from the die substrate 2106 by the spacers 2802 and extend from the top surface of the molding compound 2116 to the conductive elements 2110. In some embodiments, the top portions of the vias 2902 extend laterally through the top portion of the molding compound 2116, forming a first layer for a top RDL in the molding compound 2116. Forming the spacers 2802 after the second etch permits the spacers to be formed full height within the via openings 2302. In some embodiments, a barrier layer, seed layer and metal layer are formed in the via openings 2302, and then reduced by CMP or the like. Thus, discrete steps form forming the conductive elements of the first layer of the top RDL can be consolidated into the via formation process, reducing costs and increasing throughput.

Figure 30:
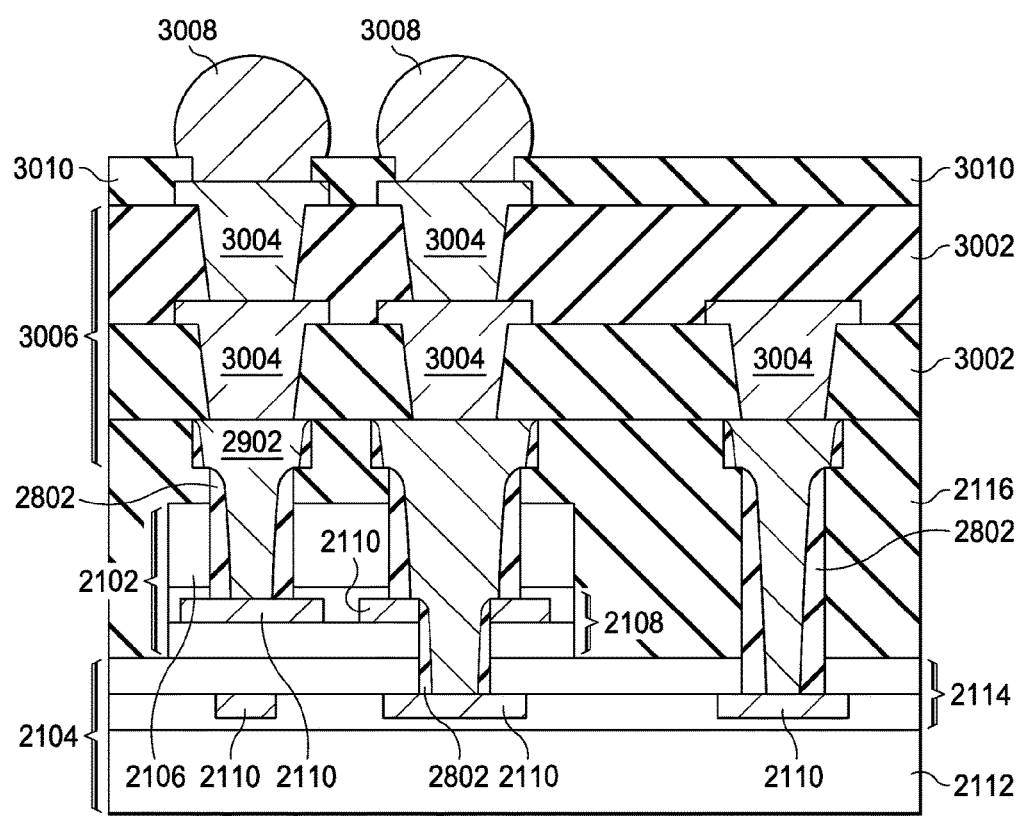

FIG. 30 is a cross-sectional view illustrating formation of a top RDL 3006 and connectors 3008 according to an embodiment. In some embodiments, the top RDL 302, with one or more top RDL insulating layers 3002 and conductive elements 3004 are formed as described above. Additionally, a protective layer 3010 and one or more connectors 3008 are formed over the top RDL 3006 as describe above. While the conductive elements 3004 in the top RDL 3006 are illustrates as being aligned directly over the lower portions of the vias 2902, it will be understood that the upper portions of the vias 2902 extend, in some embodiments, laterally from the lower portions of the vias. In such embodiments, the top RDL conductive elements 3004 are aligned outside of the lower portions of the vias 2902.

Figure 31A:
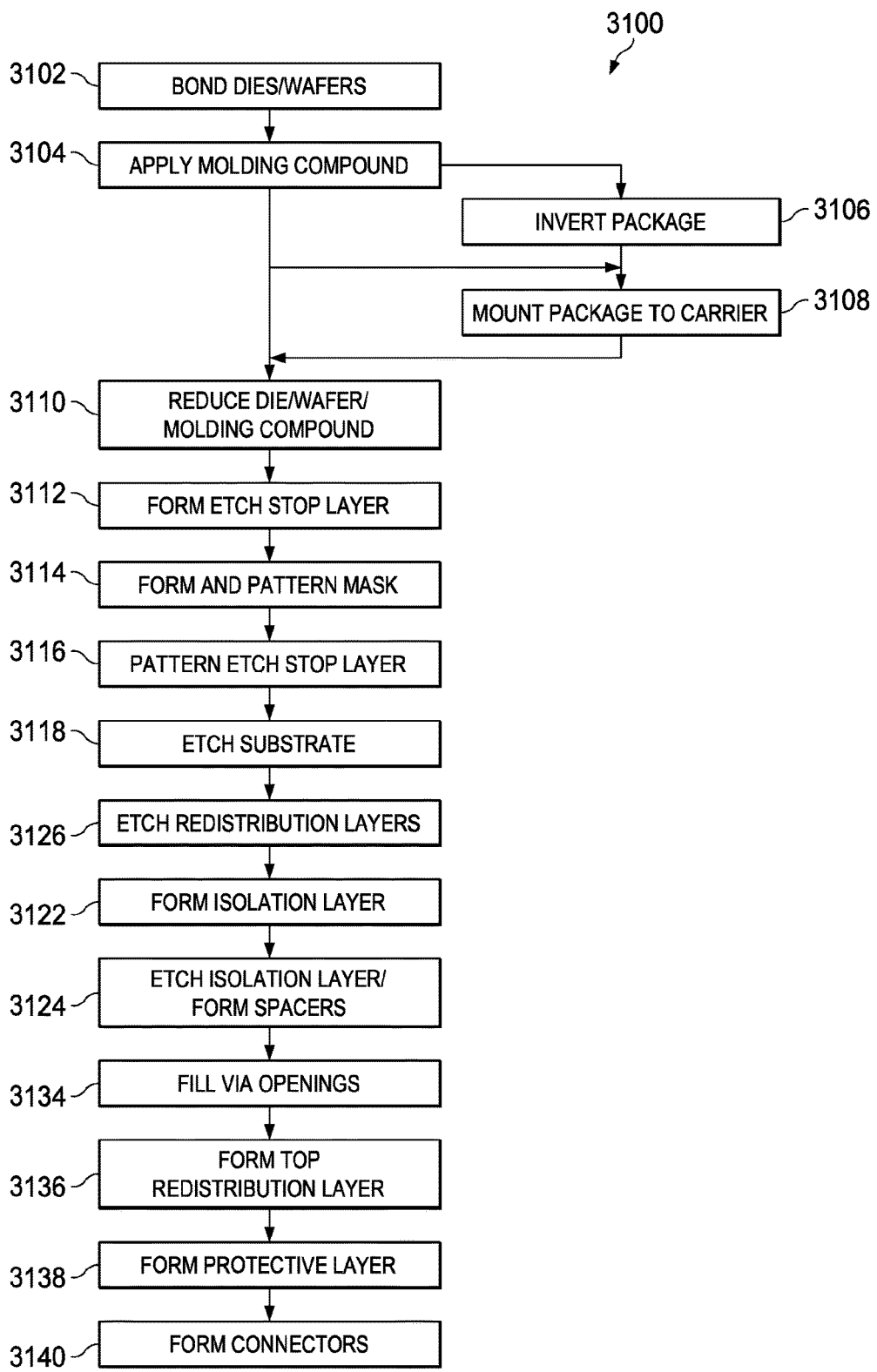
FIGS. 31A-31C are flow diagrams illustrating a method of forming chip-on-wafer structures according to some embodiments.

FIG. 31A is a flow diagram illustrating a method 3100 of forming chip-on-wafer structures according to some embodiments. Initially one or more dies are bonded to a wafer in block 3102, or two wafers are bonded together. A molding compound is formed over the bonded die and wafer in block 3104. In some embodiments, the package is inverted in block 3106 and mounted to a carrier in block 3108. The package is reduced by CMP, grinding, polishing or otherwise reducing the die, wafer or molding compound on block 3110. In some embodiments, an etch stop layer is formed in block 3112. A first mask is formed and patterned in block 3114 and the etch stop layer is patterned in block 3116. The substrate of the die or wafer is etched in block 3118 and the RDLs between the wafer and die are etched in block 3126. The isolation layer is formed in block 3122 and etched to form the spacers in block 3124. Via openings formed by the etching are filled with a conductive material in block 3134. A top RDL is formed in block 3136. In some embodiments, a protective layer is formed over the top TDL in block 3138. Connectors are formed over the top RDL in contact with conductive elements of the top RDL in block 3140.

Figure 31B:
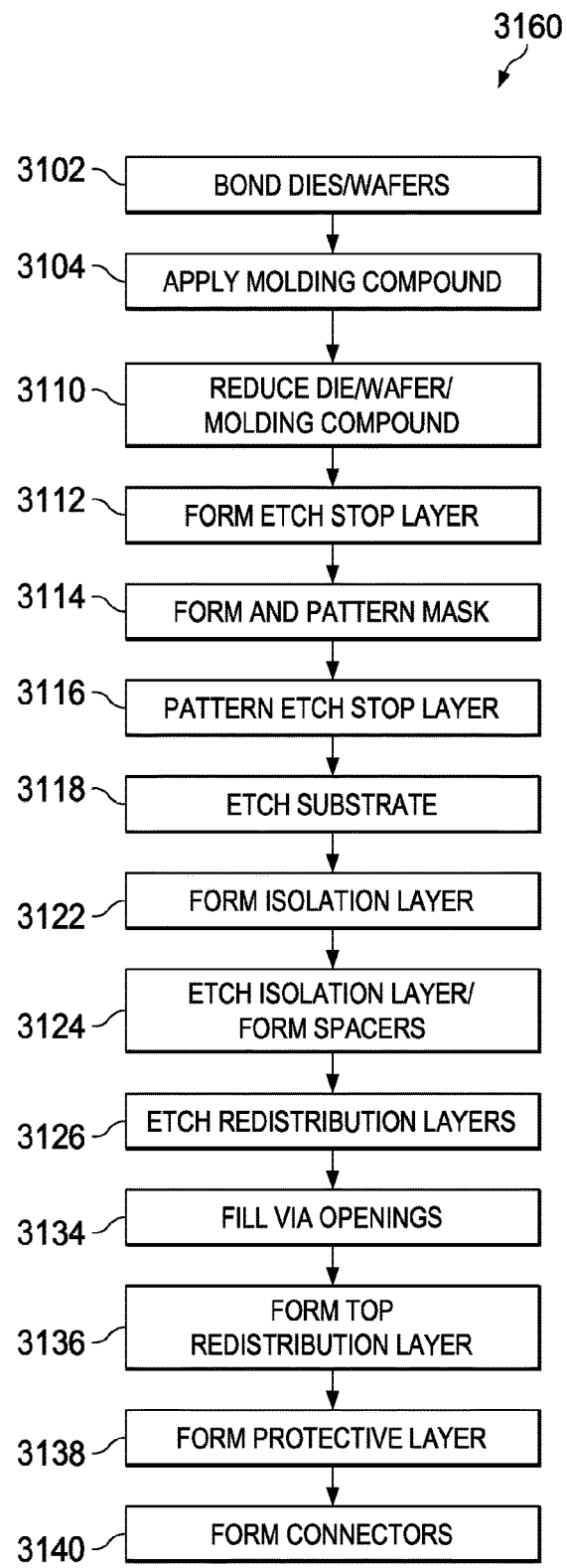

FIG. 31B is a flow diagram illustrating a method 3160 of forming chip-on-wafer structures according to other embodiments. In such embodiments, partial height spacers are formed by a process similar to that described above. In some embodiments, the step of inverting the package and mounting the package to a carrier is skipped. Additionally, the isolation layer is formed in block 3122 after etching the substrate in block 3118. The isolation layer is etched in block 3124, and the RDLs are etched in block 3126 using the spacers as masks for etching the RDLs. The via openings formed by the etching are then filled in block 3134, and the process continues as described above.

Figure 31C:
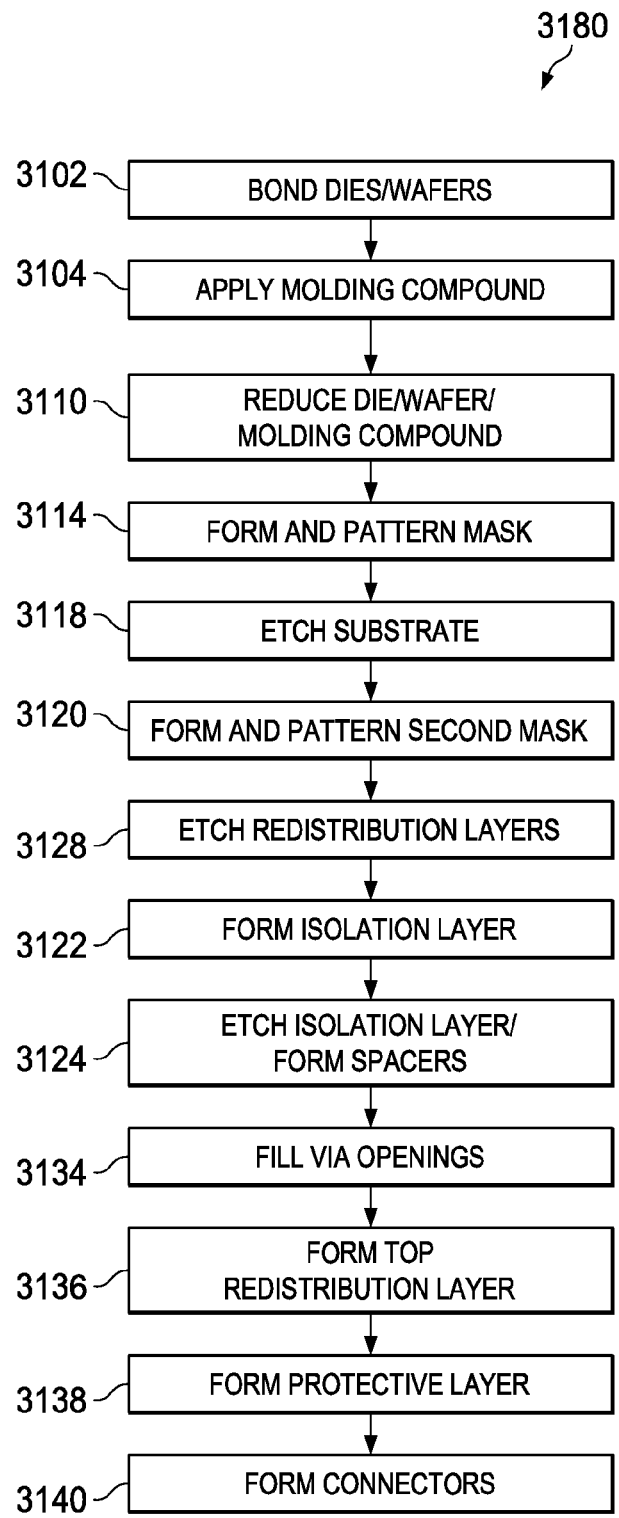

FIG. 31C is a flow diagram illustrating a method 3160 of forming chip-on-wafer structures according to other embodiments. In such embodiments, a dual damascene technique is used to form vias with upper portions that are wider than, or extend laterally from, the lower portions of the vias. In some embodiments, the substrate is etched in block 3118, and a second mask is formed and patterned in block 3120. The RDLs are etched in block 3128, with the second mask defining the upper portions of the via openings. The isolation layer is formed in block 3122, and the process continues as described above.

Thus, according to an embodiment, a package comprises a first redistribution layer (RDL) disposed on a first side of a first semiconductor substrate and a second RDL disposed on a second semiconductor substrate, with the first RDL is bonded to the second RDL. First conductive elements are disposed in the first RDL and the second RDL. First vias extend from one or more of the first conductive elements through the first semiconductor substrate to a second side of the first semiconductor substrate opposite the first side. First spacers are interposed between the first semiconductor substrate and the first vias and each extend from a respective one of the first conductive elements through the first semiconductor substrate.

According to another embodiment, a package comprises a first substrate having a first redistribution layer (RDL) disposed on a first side of the first substrate, with the first RDL having a one or more first conductive elements disposed therein. A die has a second substrate and a second RDL disposed on a first side of the second substrate, with the second RDL having a one or more second conductive elements disposed therein. The first RDL is bonded to the second RDL. A molding compound is disposed over the first RDL and over the die, a first portion of the molding compound extending over a second side of the second substrate opposite the first side. Spacers are disposed in the second substrate, each of the spacers extending from at least the first side of the second substrate through the first portion of the molding compound. Vias extending through the first portion of the molding compound and through the second substrate, each of the vias contacting at least one of the one or more first conductive elements or the one or more second conductive elements, and each of the vias electrically insulated from the second substrate by a respective one of the spacers.

A method according to an embodiment comprises providing a first substrate having a first redistribution layer (RDL) disposed thereon, with conductive elements disposed in the first RDL and providing a second substrate having a second RDL disposed thereon, where the first RDL is bonded to the second RDL, and with conductive elements disposed in the second RDL. A first via opening is etched through at least the first substrate and an isolation layer is formed over the first substrate and extending into the first via opening. The isolation layer is etched, with the etching forming spacers on sidewalls of the first via opening. At least one of the spacers extends through the first substrate and has a bottom surface disposed on at least one of the conductive elements. A first via is formed in the first via opening and is electrically connected to at least one of the conductive elements. The first via extends from one of the conductive elements through the first substrate to at least a top side of the first substrate opposite the first RDL. One or more the spacers are interposed between the first substrate and the first via and electrically insulate the first via from the first substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
providing a first substrate having a first redistribution layer (RDL) disposed thereon, wherein conductive elements are disposed in the first RDL;
providing a second substrate having a second RDL disposed thereon, the first RDL bonded to the second RDL, wherein conductive elements are disposed in the second RDL;
etching a first via opening through at least the first substrate;
forming an isolation layer over the first substrate and extending into the first via opening;
etching the isolation layer, the etching forming spacers on sidewalls of the first via opening, at least one of the spacers extending through the first substrate and having a bottom surface disposed on at least one of the conductive elements; and
forming a first via in the first via opening and electrically connected to at least one of the conductive elements;
wherein the first via extends from one of the conductive elements through the first substrate to at least a top side of the first substrate opposite the first RDL; and
wherein one or more of the spacers are interposed between the first substrate and the first via and electrically insulate the first via from the first substrate.

2. The method of claim 1, further comprising:
forming a third RDL over the first substrate; and
forming a connector on the third RDL, the connector electrically connected to the first via through the third RDL.

3. The method of claim 1, further comprising:
forming a molding compound over the second RDL such that the second RDL is disposed between the molding compound and the second substrate;
etching a second via opening through at least the molding compound; and
forming a second via in the second via opening and electrically connected to at least one of the conductive elements;
wherein the molding compound is formed around the first substrate; and
wherein the first via and the second via are formed in a same process step.

4. The method of claim 3, wherein a first portion of the molding compound extends over the first substrate and wherein the first via extends through the first portion of the molding compound.

5. The method of claim 4, further comprising:
etching into the first RDL to extend the first via opening through at least a portion of the first RDL;
wherein etching the first RDL opening comprises etching the first portion of the molding compound to form an upper portion of the first via opening to have a greater width than a lower portion of the first via opening; and
wherein the forming the isolation layer is performed after the etching the first RDL.

6. The method of claim 5, wherein the etching the isolation layer forms at least a first one of the spacers in the upper portion of the first via opening spaced apart from a second one of the spacers in the lower portion of the first via opening.

7. The method of claim 3, further comprising:
forming a third RDL on the molding compound; and
forming a connector on the third RDL, the connector electrically connected to the first via through the third RDL.

8. A method comprising:
bonding a first redistribution layer (RDL) to a second RDL, the first RDL disposed on a first substrate and comprising first conductive features, the second RDL disposed on a second substrate and comprising second conductive features;
etching a plurality of first openings in the first substrate, the first openings exposing the first conductive features;
etching a plurality of second openings in the first RDL and the second RDL, the second openings exposing the second conductive features;
depositing an isolation layer over the first substrate and along sidewalls of the first and second openings;
etching the isolation layer to remove horizontal portions of the isolation layer, remaining vertical portions of the isolation layer forming spacers along sidewalls of the first and second openings; and
filling the first and second openings with a conductive material to form a plurality of first vias in the first openings and a plurality of second vias in the second openings, the first vias electrically connected to the first conductive features, the second vias electrically connected to the first and second conductive features, the first and second vias electrically insulated from the first and second substrates by the spacers.

9. The method of claim 8, further comprising:
forming a third RDL over the first substrate; and
forming a plurality of connectors on the third RDL, the connectors electrically connected to the first and second vias through the third RDL.

10. The method of claim 9, wherein the first conductive features are electrically connected to the third RDL by the first vias, and the second conductive features are electrically connected to the third RDL by the second vias.

11. The method of claim 8, wherein the etching the first openings comprises:
forming the first openings through the first substrate in a first etching process; and
extending the first openings at least partially into the first RDL in a second etching process, the second etching process using the first conductive features as an etch stop layer.

12. The method of claim 8, wherein the etching the second openings comprises:
forming the second openings through the first substrate in a first etching process; and
extending second first openings through the first RDL and at least partially into the second RDL in a second etching process, the second etching process using the second conductive features as an etch stop layer.

13. The method of claim 8, wherein the first and second openings are filled with the conductive material simultaneously.

14. A method comprising:
bonding a first redistribution layer (RDL) to a second RDL, the first RDL disposed on a first substrate, the second RDL disposed on a second substrate and comprising second conductive features;
forming an encapsulant around the first RDL and the first substrate, the encapsulant being disposed on the second RDL;
etching a plurality of first openings in the first substrate and a plurality of second openings in a first portion of the encapsulant;
depositing an isolation layer over the first substrate and along sidewalls of the first and second openings;
etching the isolation layer to remove horizontal portions of the isolation layer, remaining vertical portions of the isolation layer forming spacers along sidewalls of the first and second openings;
extending the first openings through the first RDL and at least partially into the second RDL, the first openings exposing the second conductive features;
extending the second openings through the encapsulant and at least partially into the second RDL, the second openings exposing the second conductive features; and
filling the first and second openings with a conductive material to form a plurality of vias in the first and second openings, the vias electrically connected to the second conductive features, the vias electrically insulated from the first and second substrates by the spacers.

15. The method of claim 14, further comprising:
forming a third RDL over the encapsulant; and
forming a plurality of connectors on the third RDL, the connectors electrically connected to the first and second vias through the third RDL.

16. The method of claim 14, wherein the spacers are formed along the sidewalls of the first and second openings before the first and second openings are extended.

17. The method of claim 16, wherein the extending the second openings comprises:
forming upper portions of the second openings through the first portion of the encapsulant in a first etching process; and
forming lower portions of the second openings through the first portion of the encapsulant in a second etching process, sidewalls of the lower portions of the second openings being planar with inner surfaces of the spacers.

18. The method of claim 14, wherein the first and second openings are extended before the spacers are formed along the sidewalls of the first and second openings.

19. The method of claim 18, wherein the extending the second openings comprises:
forming upper portions of the second openings through the first portion of the encapsulant in a first etching process; and
forming lower portions of the second openings through the first portion of the encapsulant in a second etching process, the upper portions having a greater width than the lower portions.

20. The method of claim 14, wherein the first RDL comprises first conductive features, and bottom surfaces of the spacers in the first openings contact the first conductive features.

* * * * *